United States Patent [19]
Segaram

[11] Patent Number: 5,410,188
[45] Date of Patent: Apr. 25, 1995

[54] ENHANCED INTEGRATED WAVESHAPING CIRCUIT

[75] Inventor: Para Segaram, Campbell, Calif.

[73] Assignee: National Semiconductor Corporation, Santa Clara, Calif.

[21] Appl. No.: 133,405

[22] Filed: Oct. 7, 1993

Related U.S. Application Data

[63] Continuation-in-part of Ser. No. 994,660, Dec. 22, 1992.

[51] Int. Cl.$^6$ .................. H03K 17/28; H03K 5/19; H03K 5/01
[52] U.S. Cl. ................................ 327/237; 327/100
[58] Field of Search ............ 307/260, 261, 262, 268

[56] References Cited

U.S. PATENT DOCUMENTS

| | | | |
|---|---|---|---|
| 3,390,283 | 6/1968 | Hannigsberg | 307/268 |
| 3,504,290 | 3/1970 | Earle | 328/164 |
| 3,612,916 | 10/1971 | O'Neill | 307/295 |
| 3,659,207 | 4/1972 | Perreault | 328/14 |
| 3,889,198 | 6/1975 | Lighthall et al. | 328/59 |
| 4,675,546 | 6/1987 | Shaw | 307/265 |

FOREIGN PATENT DOCUMENTS

| | | | |
|---|---|---|---|
| 3418213 | 11/1985 | Germany | H03K 5/01 |
| 1190493 | 11/1985 | U.S.S.R. | H03K 5/01 |

*Primary Examiner*—William L. Sikes
*Assistant Examiner*—Fetsum Abraham
*Attorney, Agent, or Firm*—Limbach & Limbach; H. Donald Nelson; Richard J. Roddy

[57] ABSTRACT

The waveshaping functions provided by a summing resistor network and filter are performed by a waveshaping circuit that can be integrated with transceiving functions within a single integrated circuit. The waveshaping circuit utilizes the edges of an oscillator signal to generate a series of pairs of logic signals which have a defined timing relationship with respect to an input data signal. Each pair of logic signals is then utilized by a corresponding number of current stages to provide both an incremental portion of an output waveform and an incremental portion of a complementary output waveform. The pair of output waveforms can then be produced by summing together all of the incremental portions of the pair of waveforms.

19 Claims, 22 Drawing Sheets

TX+

Pd

Q1

Qd1

Ph

NQd1

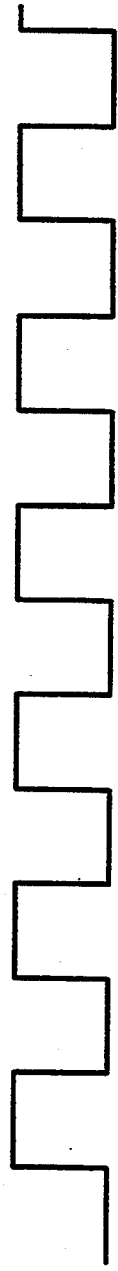
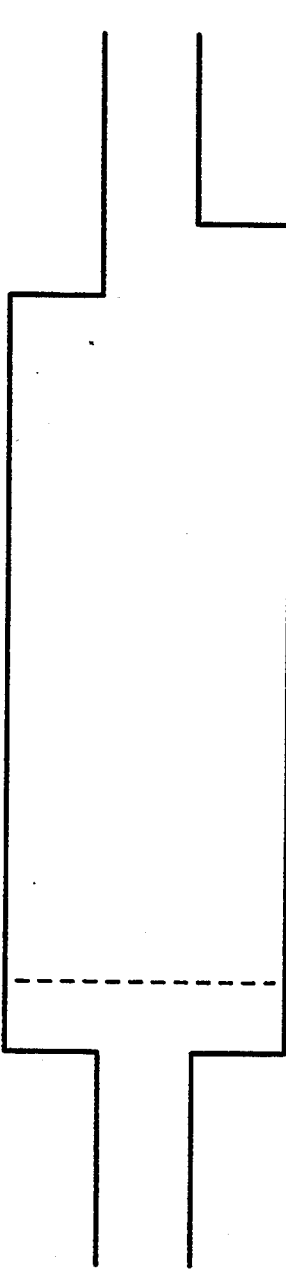
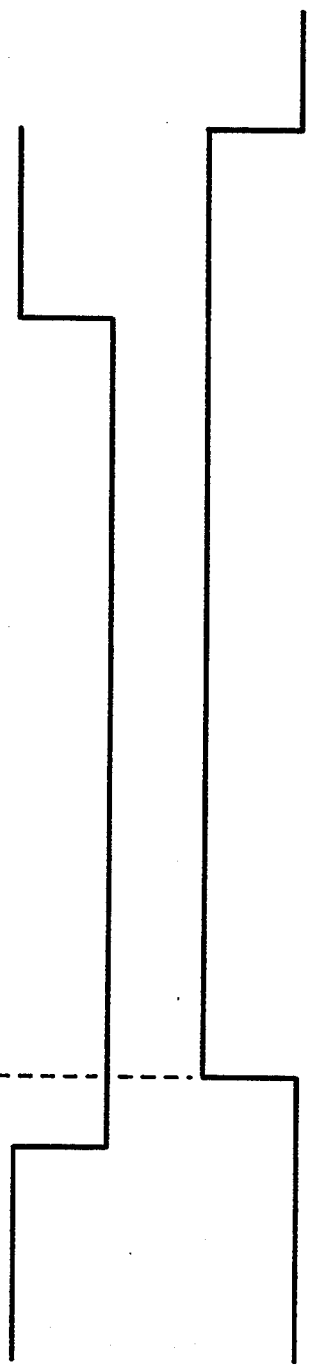
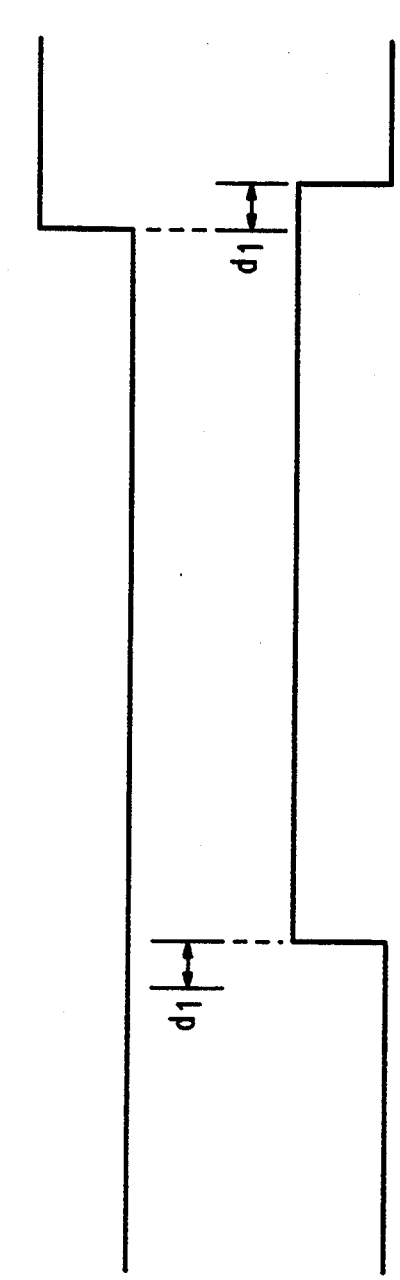
FIG. 13A  OSC2
FIG. 13B  TX+
FIG. 13C  D0 OUTPUT (RST)
FIG. 13D  D1 OUTPUT (SRT)
FIG. 13E  D5 OUTPUT (STP)
FIG. 13F  D6 OUTPUT (TTX+)

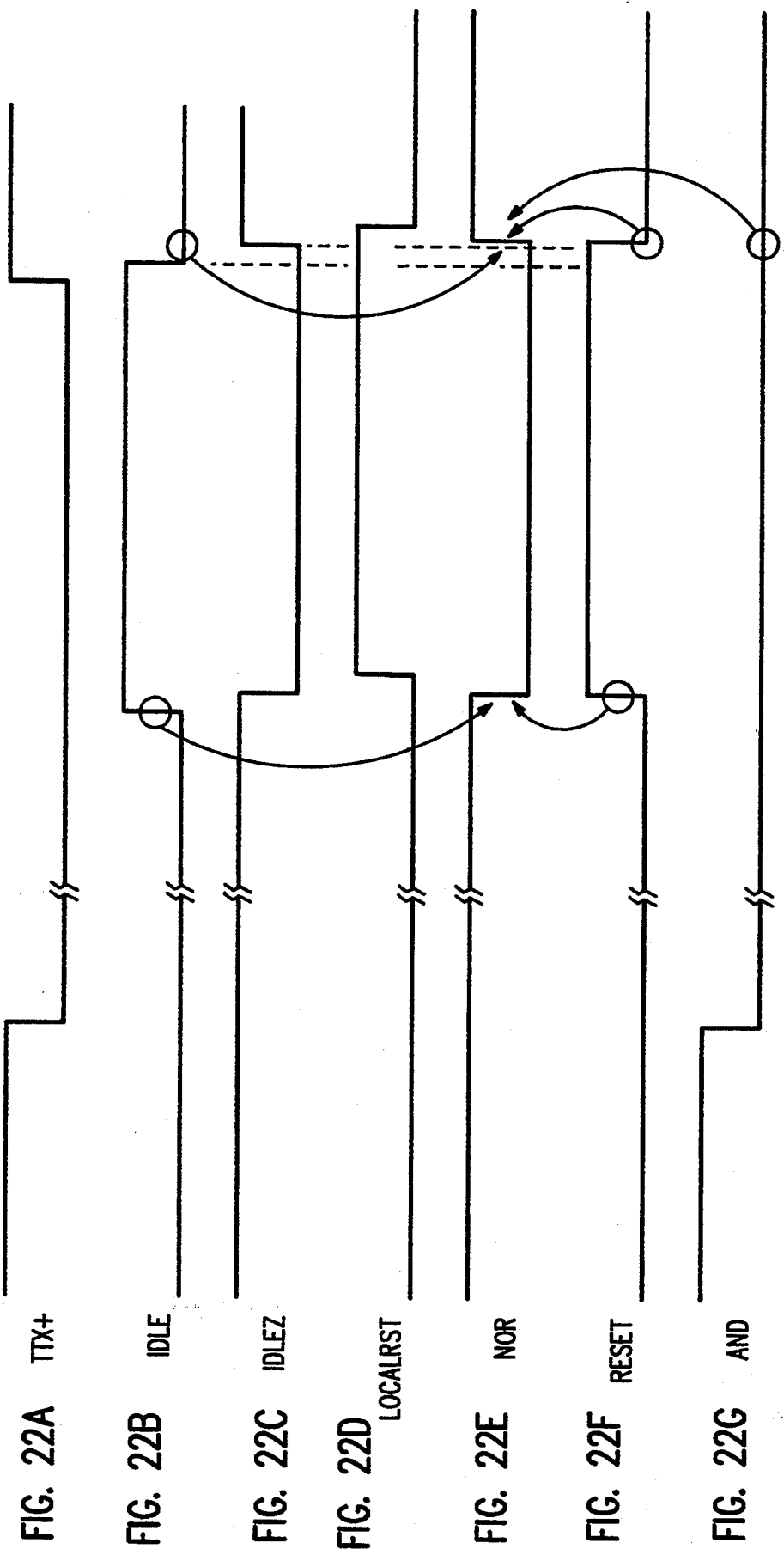

ENHANCED INTEGRATED WAVESHAPING CIRCUIT

RELATED APPLICATION

The present application is a continuation-in-part of U.S. Patent Application Ser. No. 07/994,660 filed on Dec. 22, 1992 by Para K. Segaram for AN INTEGRATED WAVESHAPING CIRCUIT.

BACKGROUND OF THE INVENTION

1. Field of the Invention

The present invention relates to semiconductor integrated circuits and, in particular, to the integration of external waveshaping functions onto an integrated circuit which drives a data signal onto the twisted-pair transmission medium of a local area network.

2. Description of the Related Art

A local area network is a communication system that allows personal computers, workstations, servers, and other devices within a small area, such as a single building or a group of buildings, to transfer information between each other. Each device connected to the network communicates with other devices on the network by following a standard which defines the operation of the network. One of the most widely accepted standards for local area networks is the IEEE 802.3 Ethernet Protocol.

The IEEE 802.3 Ethernet Protocol defines four physical layer specifications which differ primarily in the physical cables utilized. Coaxial cables are defined by a Thick Coax Ethernet (10BASE5) specification, which utilizes a double-shielded coaxial cable, and a Thin Coax Ethernet (10BASE2) specification, which utilizes a single-shielded coaxial cable. Twisted pair cables are defined by a Twisted Pair Ethernet (10BASE-T) specification and a StarLAN (1BASE5) specification.

One aspect of a twisted-pair network which is defined by the twisted-pair specification is the transmit waveform of the data signal. The data signal, which is Manchester-encoded, is shaped in accordance with the twisted-pair specification both to generate a defined amplitude step when the data signal transitions from either a logic one to a logic zero or from a logic zero to a logic one and to attenuate the higher harmonic components of the data signal.

The data signal is typically transmitted onto a twisted-pair cable by first Manchester-encoding the data signal to form an input data signal TX+ and a complementary input data signal TX−. A delayed input data signal TXd+ and a complementary delayed input data signal TXd− are then formed in response to the input data signal TX+ and the complementary input data signal TX−, respectively, by delaying both the input data signal TX+ and the complementary data signal TX− by one-half period.

Next, the four input data signals TX+, TX−, TXd+, and TXd− are resistively combined and filtered to form an output data signal V+ and a complementary output data signal V−. The resistive combination and filtering shape the transmit waveform to provide the defined amplitude step and the required attenuation. A transmit output waveform is then generated on the twisted-pair cable by feeding the output data signals V+ and V− into a transformer connected to the twisted-pair cable.

FIG. 1 shows a block diagram that illustrates a commonly utilized circuit 2 for resistively combining and filtering the input data signals TX+, TX−, TXd+, and TXd−. As shown in FIG. 1, a transmission stage 3, which is typically packaged as an integrated circuit, drives the input data signals TX+, TX−, TXd+, and TXd− onto an external summing resistor network 4 as square-wave current signals.

The external summing resistor network 4 includes an input resistor Rt, a complementary input resistor Rct, a delayed input resistor Rdt, a complementary delayed input resistor Rcdt, and a balancing resistor Rb. The summing resistor network 4 generates both a square-wave transmit voltage signal TXO+ and a square-wave complementary transmit voltage signal TXO− by summing together the voltages generated by driving the input data signal TX+ and the complementary delayed input data signal TXd− across the input resistor Rt and the complementary delayed resistor Rcdt, respectively, and by summing together the voltages generated by driving the complementary input data signal TX− and the delayed input data signal TXd+ across the complementary input resistor Rct and the delayed input resistor Rdt, respectively.

An external filter 5, which is typically implemented as a conventional low-pass L-C filter, generates the output data signal V+ and a complementary output data signal V− by attenuating the harmonic components of both the square-wave transmit voltage signal TXO+ and the square-wave complementary transmit voltage signal TXO−.

The output data signal V+ and the complementary output data signal V− are then fed into an external 2:1 transformer 6, which isolates the preceding circuitry 3, 4, and 5 from a twisted-pair cable 7, to generate a transmitted waveform Tw on the twistedpair cable 7.

FIGS. 2A–C show a waveform diagram that illustrates an example of the transmit voltage signal TXO+, the complementary transmit voltage signal TXO−, and the transmitted waveform Tw. The transmit voltage signal TX0+ and the complementary transmit voltage signal TXO− are shown as 5 volt peak-to-peak signals centered at Vcc/2. The transmitted waveform Tw is shown as a ±2.5 volt differential voltage signal in accordance with the twisted-pair specification.

One problem with utilizing circuit 2 is that since the harmonic components of the square-wave data signals TX+, TX−, TXd+, and TXd− are not attenuated prior to the external filter 5, the data signals TX+, TX−, TXd+, and TXd− radiate a significant amount of harmonic switching noise as a result of the high current levels utilized by the transmission stage 3 to drive the data signals TX+, TX−, TXd+, and TXd− onto the summing resistor network 4. The magnitude of the switching noise typically results in circuit 2 failing to satisfy FCC requirements for radiated emissions.

Another problem with utilizing circuit 2 is that the external resistor summing network 4 and the external filter 5 consume a substantial area on a circuit board.

Thus, there is a need for a waveshaping circuit that can integrate the functionality of the transmission stage 3, the summing resistor network 4, and the filter 5 into a single integrated circuit, thereby eliminating the harmonic switching noise radiated by the data signals TX+, TX−, TXd+, and TXd−, and providing increased circuit board space.

In the parent application, a waveshaping circuit was described that allowed the functionality of the summing resistor network 4 and the filter 5 to be integrated with the transmission stage 3 into a single integrated circuit. The waveshaping circuit of the parent application transformed the input data signal TX+ and the delayed input data signal TXd+ into the pair of complementary sinusoidal output waveforms V+ and V− by utilizing phase-lock-loop circuitry to produce a plurality of edges within the pulse widths of the input data signal TX+ and the delayed input data signal TXd+.

Logic circuitry was utilized to produce a pair of complementary logic signals in response to each edge, and current source circuitry was utilized to produce an incremental current in response to each pair of complementary logic signals. By summing together all of the incremental currents, the pair of complementary sinusoidal output waveforms V+ and V− can be formed.

Although the phase-lock-loop circuitry provided a series of edges that fall within the pulse widths of the input data signal TX+ and the delayed input data signal TXd+, phase-lock-loops in general consume a relatively large amount of silicon real estate and are subject to varying degrees of instability as a result of transients, temperature variations, and other related conditions.

Thus, there is a need for a waveshaping circuit that can integrate the functionality of the transmission stage 3, the summing resistor network 4, and the filter 5 into a single integrated circuit, without the use of phase-lock-loop circuitry.

SUMMARY OF THE INVENTION

The present invention provides a waveshaping circuit that transforms an input data signal and a delayed input data signal into a pair of complementary output waveforms, in accordance with the IEEE 802.3 local area network 10BASE-T specification, within a single integrated circuit. In a typical application, 10BASE-T transceiver circuitry is provided within a single integrated circuit while the waveshaping function is provided by an external summing resistor network and an external filter. By integrating the waveshaping circuit into a single integrated circuit, the need for the summing resistor network and the filter can be eliminated. By integrating the waveshaping circuit into a single integrated circuit that also includes the transceiver circuitry, the amount of silicon real estate required to implement these functions can be substantially reduced.

In accordance with the present invention, the waveshaping circuit includes a frame alignment circuit and a delayed frame alignment circuit. The frame alignment circuit generates a phase-adjusted input signal by fixing a phase relationship between an externally-generated input signal, such as the TX+ signal, and an externally-generated oscillator signal. Similarly, the delayed frame alignment circuit generates a phase-adjusted delayed input signal by fixing a phase relationship between an externally-generated delayed input signal, such as the TXd+ signal, and the externally-generated oscillator signal. The waveshaping circuit further includes a first input logic stage and a first delayed input logic stage. The first input logic stage generates a plurality of pairs of first logic signals so that each pair of first logic signals changes to a first pair of logic states in response to one of the edges of the oscillator signal that follows the leading edge of the phase-adjusted input signal, and changes to a Second pair of logic states in response to one of the edges of the oscillator signal that follows the trailing edge of the phase-adjusted input signal. Similarly, the first delayed input logic stage generates a plurality of pairs of first delayed logic signals so that each pair of first delayed logic signals changes to a first pair of logic states in response to one of the edges of the oscillator signal that follows the leading edge of the phase-adjusted delayed input signal, and changes to a second pair of logic states in response to one of the edges of the oscillator signal that follows the trailing edge of the phase-adjusted delayed input signal. In the present invention, each pair of first delayed logic signals corresponds to one pair of first logic signals. Finally, the waveshaping circuit also includes a weighted current sum stage that generates an output data signal and a complementary output data signal in response to the logic states of both the plurality of pairs of first logic signals and the plurality of pairs of first delayed logic signals. The logic states of each pair of first logic signals and its corresponding pair of first delayed logic signals simultaneously generate both an incremental portion of the output data signal and an incremental portion of the complementary output data signal so that an instantaneous value of the output data signal is determined by summing together the incremental portions of the output data signal, and so that an instantaneous value of the complementary output data signal is determined by summing together the incremental portions of the complementary output data signal.

In addition, to generate the pair of output signals with a greater resolution, the waveshaping circuit can also include a second input logic stage and a second delayed input logic stage. The second input logic stage and the second delayed input logic stage provide a greater resolution by utilizing a delayed oscillator signal. As a result, twice as many pairs of logic signals and delayed logic signals are available which, in turn, provides twice as many incremental portions of the output data signal and the complementary output data signal.

The second input logic stage generates a plurality of pairs of second logic signals so that each pair of second logic signals changes to a first pair of logic states in response to one of the edges of the delayed oscillator signal that follows the leading edge of the phase-adjusted input signal, and changes to a second pair of logic states in response to one of the edges of the delayed oscillator signal that follows the trailing edge of the phase-adjusted input signal. Similarly, the second delayed input logic stage generates a plurality of pairs of second delayed logic signals so that each pair of second delayed logic signals changes to a first pair of logic states in response to one of the edges of a delayed oscillator signal that follows the leading edge of the phase-adjusted delayed input signal, and changes to a second pair of logic states in response to one of the edges of the delayed oscillator signal that follows the trailing edge of the phase-adjusted delayed input signal. As above, each pair of second delayed logic signals corresponds to one pair of second logic signals.

When the second input logic stage and the second delayed logic stage are utilized, the weighted current sum stage generates an output data signal and a complementary output data signal in response to the logic states of the plurality of pairs of first logic signals, the plurality of pairs of second logic signals, the plurality of pairs of first delayed logic signals, and the plurality of pairs of second delayed logic signals. The logic states of each pair of first logic signals and its corresponding pair of first delayed logic signals, and the logic states of each pair of second logic signals and its corresponding pair of second delayed logic signals simultaneously generate both an incremental portion of the output data signal and an incremental portion of the complementary output data signal so that an instantaneous value of the output data signal is determined by summing together the incremental portions of the output data signal, and so that an instantaneous value of the complementary output data signal is determined by summing together the incremental portions of the complementary output data signal.

The frame alignment circuit can include, for example, a first latch, a delay line, a first delay circuit, a second delay circuit, and a second latch. The first latch generates a reset signal by latching a first reset logic state in response to the leading edge of the input signal, and by changing to a second reset logic state when a delayed stop signal is in a second delayed stop logic state. The delay line generates a start frame signal with a first start logic state, and a stop frame signal with a first stop logic state when the reset signal is in the second reset logic state, changes the logic state of the start frame signal to a second start logic state in response to a first predetermined edge of the oscillator signal that occurs after the leading edge of the input signal, and changes the logic state of the stop frame signal to a second stop logic state in response to a second predetermined edge of the oscillator signal. The first delay circuit generates a delayed start signal by transitioning to a first delayed start logic state a first delay time after the start signal transitions to the first start logic state, and by transitioning to a second delayed start logic state the first delay time after the start signal transitions to the second start logic state. The second delay circuit generates the delayed stop signal by transitioning to a first delayed stop logic state a second delay time after the stop signal transitions to the first stop logic state, and by transitioning to the second delayed stop logic state the second delay time after the stop signal transitions to the second stop logic state. The second latch generates the phase-adjusted input signal by latching a first phase logic state when the delayed start signal transitions to the second delayed start logic state, and by changing to a second phase logic state when the delayed stop signal transitions to the second delayed stop logic state.

The input logic stage can be implemented by a plurality of serially-connected latches that are configured so that a data input of the first latch of the series is connected to the phase-adjusted input signal, so that a data input of each remaining latch in the series is connected to a non-inverting output of the preceding latch in the series, so that the oscillator signal is connected to a clock input of each even-numbered latch in the series, and so that an inverted oscillator signal is connected to a clock input each odd-numbered latch in the series.

The weighted current sum stage can include, for example an output node, a complementary output node, an output resistor connected between a power supply and the output node, a complementary output resistor connected between the power supply and the complementary output node, an output capacitor connected between the output node and ground, and a complementary output capacitor connected between the complementary output node and ground. The weighted current sum stage can further include a plurality of first current stages and a plurality of second current stages. The plurality of first current stages can be implemented so that each first current stage has a first transistor connected to the output node, a first current node, and one of the logic signals of one of the pairs of logic signals; a second transistor connected to the complementary output node, the first current node, and the remaining logic signal of the one of the pairs of logic signals; and a first current source connected between the first current node and ground. Similarly, the plurality of second current stages can be implemented so that each second current stage has a first transistor connected to the output node, a second current node, and one of the logic signals of one of the pairs of delayed logic signals; a second transistor connected to the complementary output node, the second current node, and the remaining logic signal of the one of the pairs of delayed logic signals; and a second current source connected between the second current node and ground. Finally, the weighted current sum stage can additionally include a third current source connected between the output resistor and ground, and a fourth current source connected between the complementary output resistor and ground.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIG. 9A shows an example of the input data signal TXO+ which has been divided into a first propagation delay period through a twelfth propagation delay period. FIG. 9B shows a resulting sine wave 68 which is created by incrementally adding and subtracting the first through the nth incremental data currents.

FIGS. 13A–13F are timing diagrams illustrating the operation of rame alignment circuit 110.

FIGS. 22A-22G are timing diagrams illustrating the operation of low power circuit 190.

DETAILED DESCRIPTION

Figure 3:
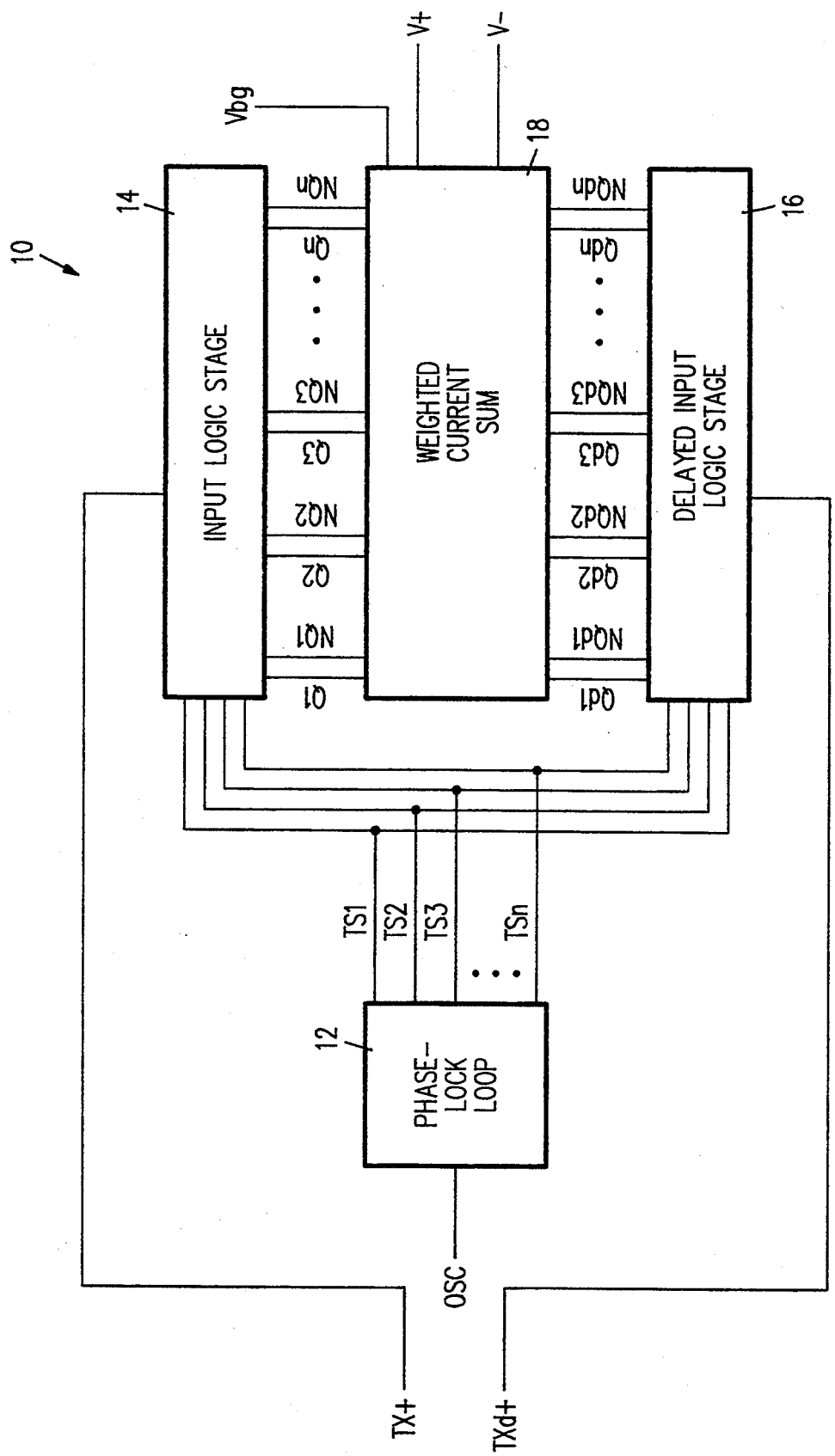
FIG. 3 is a block diagram illustrating an embodiment of a waveshaping circuit 10.

FIG. 3 shows a block diagram that illustrates an embodiment of a waveshaping circuit 10 in accordance with the parent application. As described in greater detail below, waveshaping circuit 10 transforms an input data signal TX+ and a delayed input data signal TXd+ into a pair of complementary sinusoidal output waveforms V+ and V−, as defined by the IEEE 802.3 local area network 10BASE-T specification, without the use of external components.

Waveshaping circuit 10 can eliminate the need for external waveshaping components by utilizing phase-lock-loop circuitry to produce a plurality of edges within the pulse widths of the input data signal TX+ and the delayed input data signal TXd+, logic circuitry to produce a pair of complementary logic signals in response to each edge, and current source circuitry to produce an incremental current in response to each pair of complementary logic signals. As a result, a sinusoidal waveform can be generated by periodically adding and subtracting each incremental current to the total current, which is then sunk to ground through a resistive load.

As shown in FIG. 3, waveshaping circuit 10 includes a phase-lock-loop stage 12 that generates a series of incrementally-delayed timing signals TS1-TSn in response to an externally provided oscillator signal OSC, an input logic stage 14 that generates a series of pairs of complementary logic signals Q1/NQ1-Qn/NQn in response to the series of timing signals TS1-TSn and the input data signal TX+, a delayed input logic stage 16 that generates a series of pairs of complementary delayed logic signals Qd1/NQd1-Qdn/NQdn in response to the series of timing signals TS1-TSn and the delayed input data signal TXd+, and a weighted current sum stage 18 that generates the output data signal V+ and the complementary output data signal V− in response to both the series of pairs of complementary logic signals Q1/NQ1-Qn/NQn and the series of pairs of complementary delayed logic signals Qd1/NQd1-Qdn/NQdn.

Figure 4:
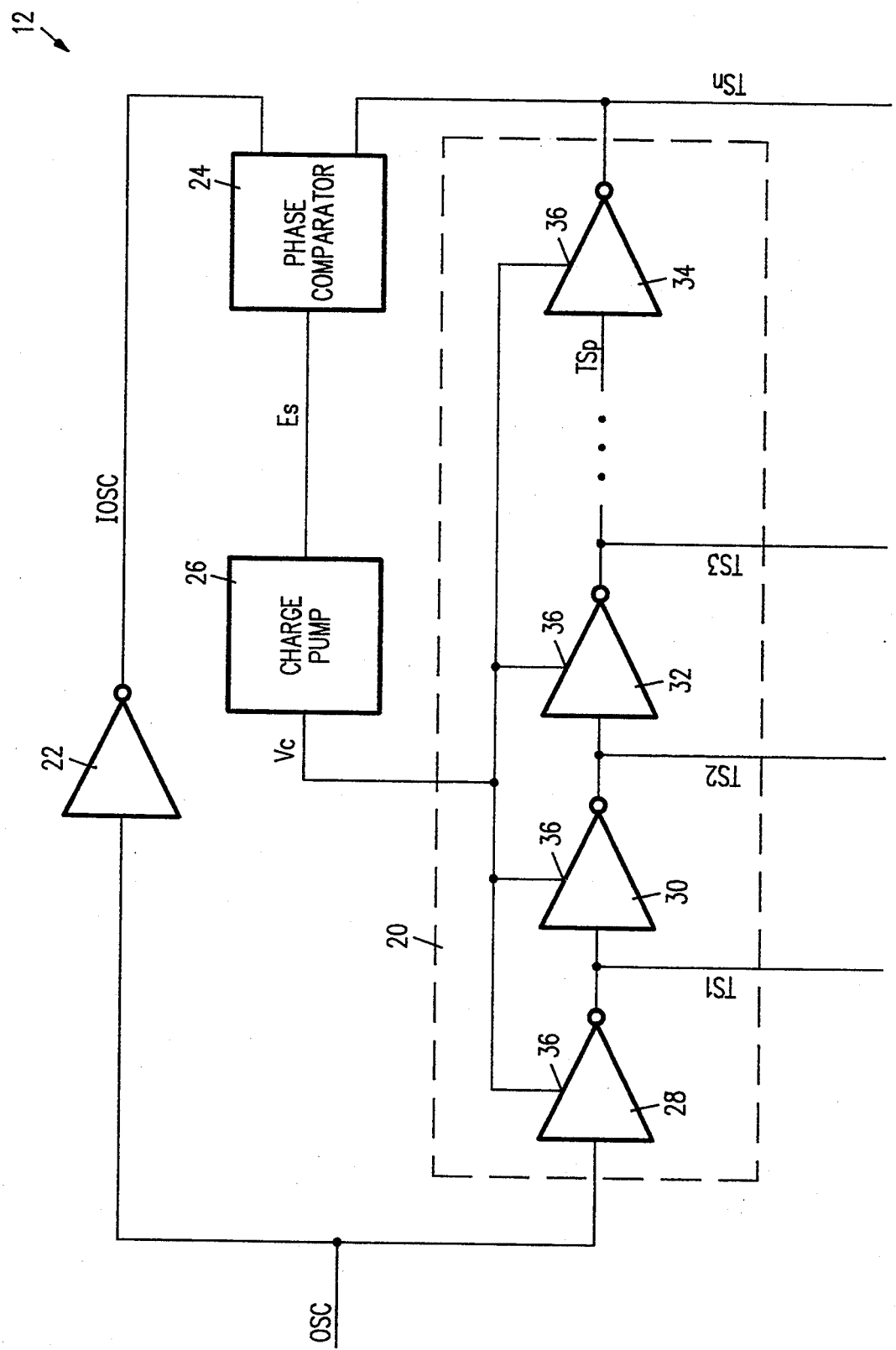
FIG. 4 is a block diagram illustrating an embodiment of a phase-lock-loop 12.

FIG. 4 shows a block diagram that illustrates an embodiment of phase-lock-loop stage 12 in accordance with the parent application. As shown in FIG. 4, phase-lock-loop stage 12 includes an inverter substage 20 that generates the series of incrementally-delayed timing signals TS1-TSn in response to the oscillator signal OSC and a control voltage Vc, an oscillator inverter 22 that generates an inverted oscillator signal IOSC, a phase comparator 24 that generates an error signal Es in response to a difference between the inverted oscillator signal IOSC and the nth timing signal TSn where the nth timing signal TSn represents the total number of timing signals generated by phase-lock-loop 12, and a charge pump 26 that generates the control voltage Vc in response to the error signal Es.

Inverter substage 20 is illustrated in FIG. 4 as a series of inverter gates including a first inverter gate 28, a second inverter gate 30, a third inverter gate 32, and a nth inverter gate 34 where nth inverter gate 34 corresponds to the nth timing signal TSn.

As further shown in FIG. 4, first inverter gate 28 generates the first timing signal TS1 in response to the oscillator signal OSC, second inverter gate 30 generates the second timing signal TS2 in response to the first timing signal TS1, and third inverter gate 32 generates the third timing signal TS3 in response to the second timing signal TS2. Similarly, the nth inverter gate 34 generates the nth timing signal TSn in response to a preceding timing signal TSp.

The first timing signal TS1 and each succeeding odd-numbered timing signal are equivalent to a time delayed inverse of the oscillator signal OSC where the time delay Td of each timing signal TS1-TSn is equivalent to the propagation delay introduced by each preceding inverter gate.

As described in greater detail below, the propagation delay of each inverter gate 28, 30, 32, and 34 is substantially equivalent. Thus, the delay time Td for each timing signal TS1-TSn is defined by:

$$Td = (n) * (\text{the propagation delay})$$

where n represents the total number of preceding inverter gates.

For example, when the logic state of the oscillator signal OSC changes from a logic low to a logic high, the logic state of the first timing signal TS1 will change from a logic high to a logic low after the propagation delay introduced by the first inverter gate 28 while the logic state of the third timing signal TS3 will change from a logic high to a logic low after the propagation delay introduced by the first three inverter gates 28, 30, and 32.

Similarly, the second timing signal TS2 and each succeeding even-numbered timing signal are equivalent to a time delayed oscillator signal where the time delay Td is defined as above. Thus, when the logic state of the oscillator signal OSC changes from a logic low to a logic high, the logic state of the second timing signal TS2 will change from a logic low to a logic high after the propagation delay introduced by the first two inverter gates 28 and 30.

The propagation delay of an inverter gate is a function of the input voltage, the channel width and length of the transistors used to fabricate the inverter gate, and the fabrication process. Thus, by forming the transistors of inverter gates 28, 30, 32, and 34 during the same fabrication process so that each equivalent transistor has a substantially equivalent channel width and length, the propagation delay of each inverter gate 28, 30, 32, and 34 will be determined principally by the input voltage.

As shown in FIG. 4, each inverter gate 28, 30, 32, and 34 has an input voltage terminal 36 which is connected to the control voltage Vc. Thus, the control voltage Vc sets an equivalent propagation delay across each of the inverter gates 28, 30, 32, and 34.

The control voltage Vc is controlled by the feedback action of oscillator inverter 22, phase comparator 24, and charge pump 26 so that the delay time Td of the nth timing signal is approximately one half of the period of the oscillator signal OSC.

As shown in FIG. 4, phase comparator 24 receives the inverted oscillator signal IOSC from oscillator inverter 22 and the nth timing signal TSn from the nth inverter gate 34, compares the two signals, and generates an error Es in response to a difference between the two signals. Charge pump 24 responds to the error signal Es by either increasing or decreasing the control voltage Vc.

The requirement for oscillator inverter 22 is dependent on whether the nth inverter gate 34 is an odd-numbered or an even-numbered inverter gate. When the logic state of the oscillator signal OSC transitions from a logic low to a logic high, the nth timing signal TSn will transition from a logic low to a logic high when the nth inverter gate 34 is even-numbered and will transition from a logic high to a logic low when the nth inverter gate 34 is odd-numbered.

Thus, in order to compare the falling edge of the oscillator signal OSC to the rising edge of an even-numbered nth timing signal TSn, the oscillator signal OSC must be inverted. As described in greater detail below, in the preferred embodiment of the parent application, 12 inverter gates are utilized.

By utilizing the feedback action of oscillator inverter 22, phase comparator 24, and charge pump 26 to generate a total propagation delay which is approximately one-half of the period of the oscillator signal OSC, a precise propagation delay, which is equivalent to the total number of inverter gates divided by one-half the period of the oscillator signal OSC, is generated.

As stated above, waveshaping circuit 10 generates the output data signal V+ and the complementary output data signal V− in response to both the input data signal TX+ and the delayed input data signal TXd+ in accordance with the twisted-pair specification of the IEEE 802.3 local area network standard. In the twisted-pair specification, the input data signal TX+ is defined as a 10 MHz (megahertz) Manchester-encoded signal. The delayed input data signal TXd+ is defined as a delayed 10 MHz Manchester-encoded signal where the delay is equivalent to one-half the period of the input data signal TX+ or 50 ns (nanoseconds).

In the preferred embodiment, a signal which is equivalent and synchronized to the input data signal TX+ is utilized as the oscillator signal OSC. Thus, in the preferred embodiment, a propagation delay of 4.167 ns results from dividing the 12 inverter gates of the preferred embodiment by the 50 ns one-half period of the oscillator signal OSC.

Therefore, for example, if the logic state of the oscillator signal OSC changes at t=0, then the logic state of the first timing signal TS1 will change approximately 4.167 ns later, the logic state of the second timing signal TS2 will change approximately 8.334 ns later, and the logic state of the twelfth timing signal will change approximately 50 ns later.

Figure 5:
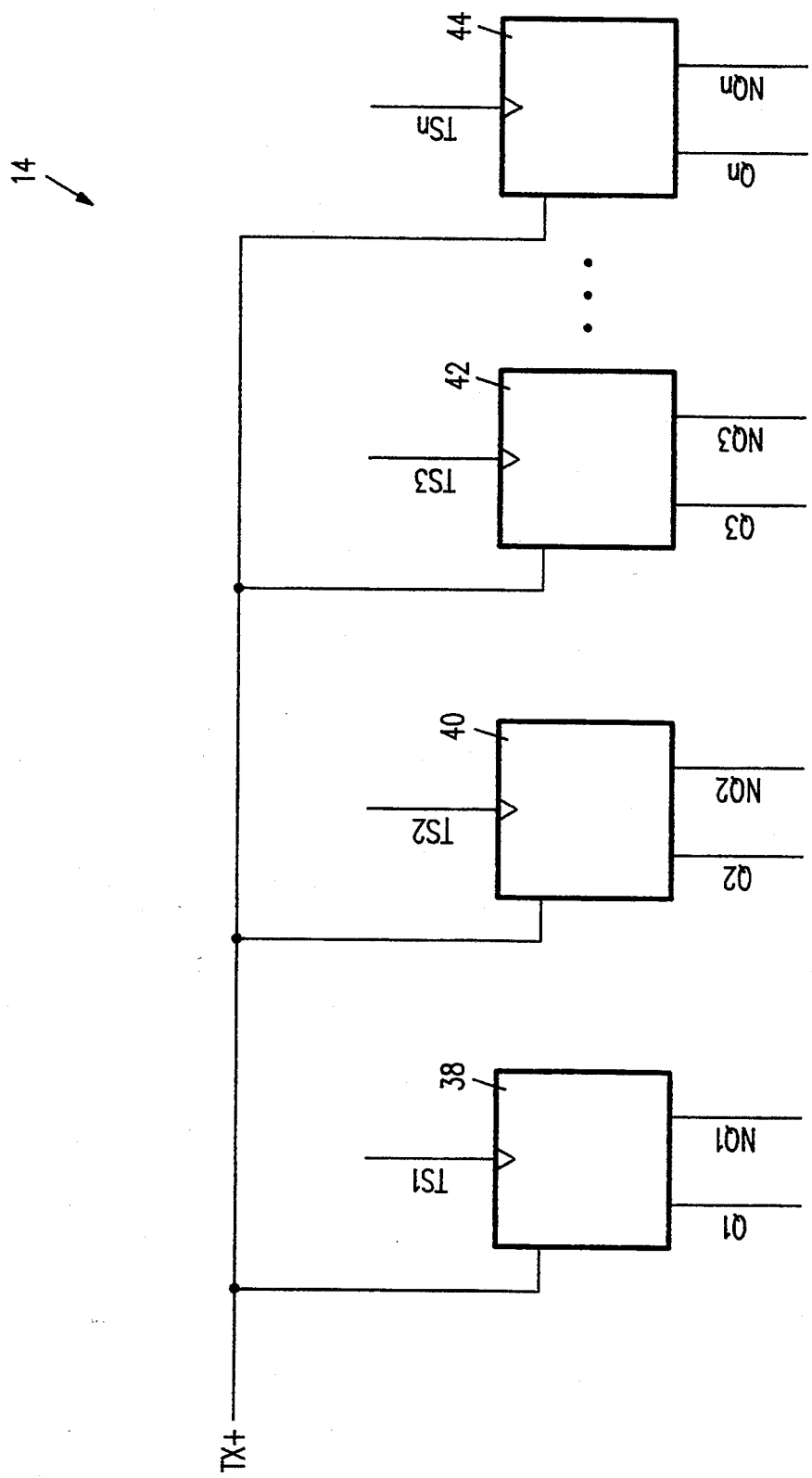
FIG. 5 is a block diagram illustrating an embodiment of an input logic stage 14.

FIG. 5 shows a block diagram that illustrates an embodiment of input logic stage 14. As shown in FIG. 5, input logic stage 14 generates the series of pairs of complementary logic signals Q1/NQ1–Qn/NQn in response to the series of timing signals TS1–TSn and the input data signal TX+. Each timing signal TS1–TSn generates one corresponding pair of complementary logic signals by periodically latching the input data signal TX+ so that the logic state and an inverse logic state of the input data signal TX+ are simultaneously provided by the one corresponding pair of complementary logic signals.

The transmit logic stage is illustrated in FIG. 5 as a series of logic blocks that includes a first logic block 38, a second logic block 40, a third logic block 42, and a nth logic block 44 where the nth logic block 44 corresponds to the nth inverter gate 34. As further shown in FIG. 5, first logic block 38 generates the first logic signal Q1 and the first complementary logic signal NQ1 in response to both the input data signal TX+ and the first timing signal TS1, second logic block 40 generates the second logic signal Q2 and the second complementary logic signal NQ2 in response to both the input data signal TX+ and the second timing signal TS2, and third logic block 42 generates the third transmit logic signal Q3 and the third complementary transmit logic signal NQ3 in response to both the input data signal TX+ and the third timing signal TS3. Similarly, the nth logic block 44 generates the nth transmit logic signal Qn and the nth complementary transmit logic signal NQn in response to both the input data signal TX+ and the nth timing signal TSn.

The logic blocks 38, 40, 42, and 44 are configured so that each of the logic signals Q1–Qn is equivalent to the period and logic state of the input data signal TX+ that exists when the logic state of each corresponding timing signal TS1–TSn transitions either from a logic low to a logic high or from a logic high to a logic low.

For example, if the logic state of the input data signal TX+ is high when the first timing signal TS1 transitions either from a logic low to a logic high or from a logic low to a logic high, the logic state of the first logic signal Q1 will also be high.

Similarly, the complementary logic signals NQ1–NQn are equivalent to the period and the inverse of the logic state of the input data signal TX+ that exists when the logic state of each corresponding timing signal TS1–TSn transitions either from a logic low to a logic high or from a logic high to a logic low.

In operation, since the oscillator signal OSC is synchronized to the input data signal TX+, when the logic state of the input data signal TX+ transitions from a logic low to a logic high, the logic state of the first timing signal TS1 will transition from a logic high to a logic low and the first logic signal Q1 will transition from a logic low to a logic high after a delay principally introduced by the first inverter gate 28 (see FIG. 4).

Similarly, the logic state of the second timing signal TS2 and the second logic signal Q2 will transition from a logic low to a logic high after a delay principally introduced by the first two inverter gates 28 and 30 (see FIG. 4).

Therefore, when the logic state of the input data signal TX+ transitions from a logic low to a logic high, each logic signal Q1–Qn will transition to a logic high and each complementary logic signal NQ1–NQn will transition to a logic low after the delay time associated with its corresponding inverter gate.

Figure 6:
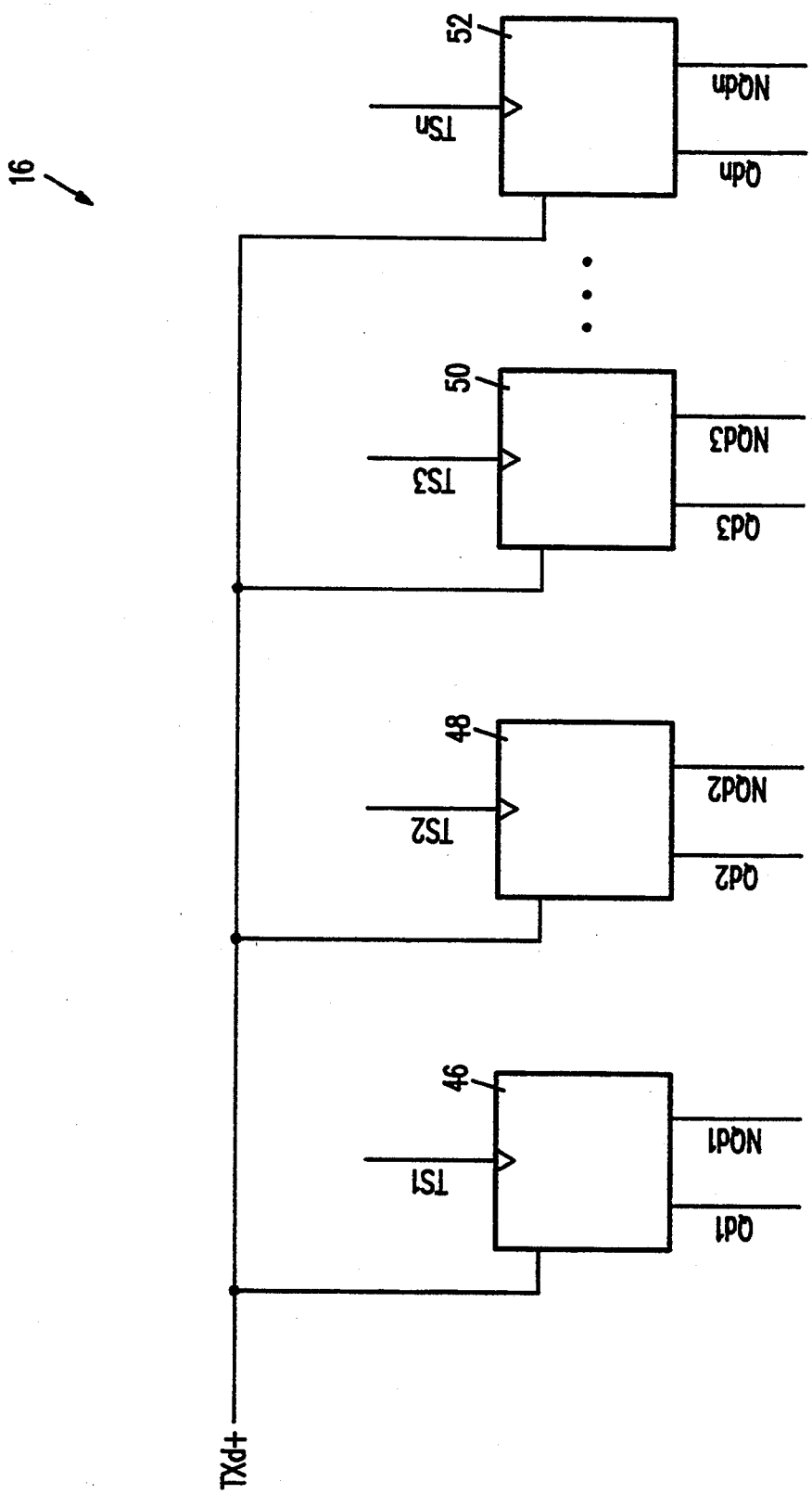
FIG. 6 is a block diagram illustrating an embodiment of a delayed input logic stage 16.

FIG. 6 shows a block diagram that illustrates an embodiment of delayed input logic stage 16 in accordance with the parent application. As can be seen in FIG. 6, the configuration of delayed input logic stage 16, which includes a series of delayed logic blocks including a first delayed logic block 46, a second delayed logic block 48, a third delayed logic block 50, and an nth delayed logic block 52, is substantially identical to the configuration of input logic stage 14 as shown in FIG. 5. The only difference between the logic stage 14 and delayed input logic stage 16 is that the series of pairs of complementary delayed logic signals Qd1/NQd1–Qdn/NQdn are generated in response to the series of timing signals TS1-TSn, respectively, and the delayed input data signal TXd+.

As with input logic stage 14, the logic blocks 46, 48, 50, and 52 are configured so that each of the delayed input logic signals Qd1-Qdn is equivalent to the logic state of the delayed input data signal TXd+ that exists when the logic state of each corresponding timing signal TS1-TSn transitions either from a logic low to a logic high or from a logic high to a logic low.

Since the delayed input data signal TXd+ is delayed one-half a period from the input data signal TX+, when the logic state of the input data signal TX+ transitions from a logic low to a logic high, each delayed input logic signal Qd1-Qdn will transition to a logic high and each complementary delayed transmit logic signal NQd1-NQdn will transition to a logic low after both the delay time associated with its corresponding inverter gate and the one-half period delay.

As shown in FIGS. 5 and 6, the series of pairs of complementary delayed logic signals Qd1/NQd1-Qdn-NQdn corresponds to the series of pairs of complementary logic signals Q1/NQ1-Qn/NQn so that each pair of delayed logic signals corresponds to one pair of logic signals.

Figure 7:
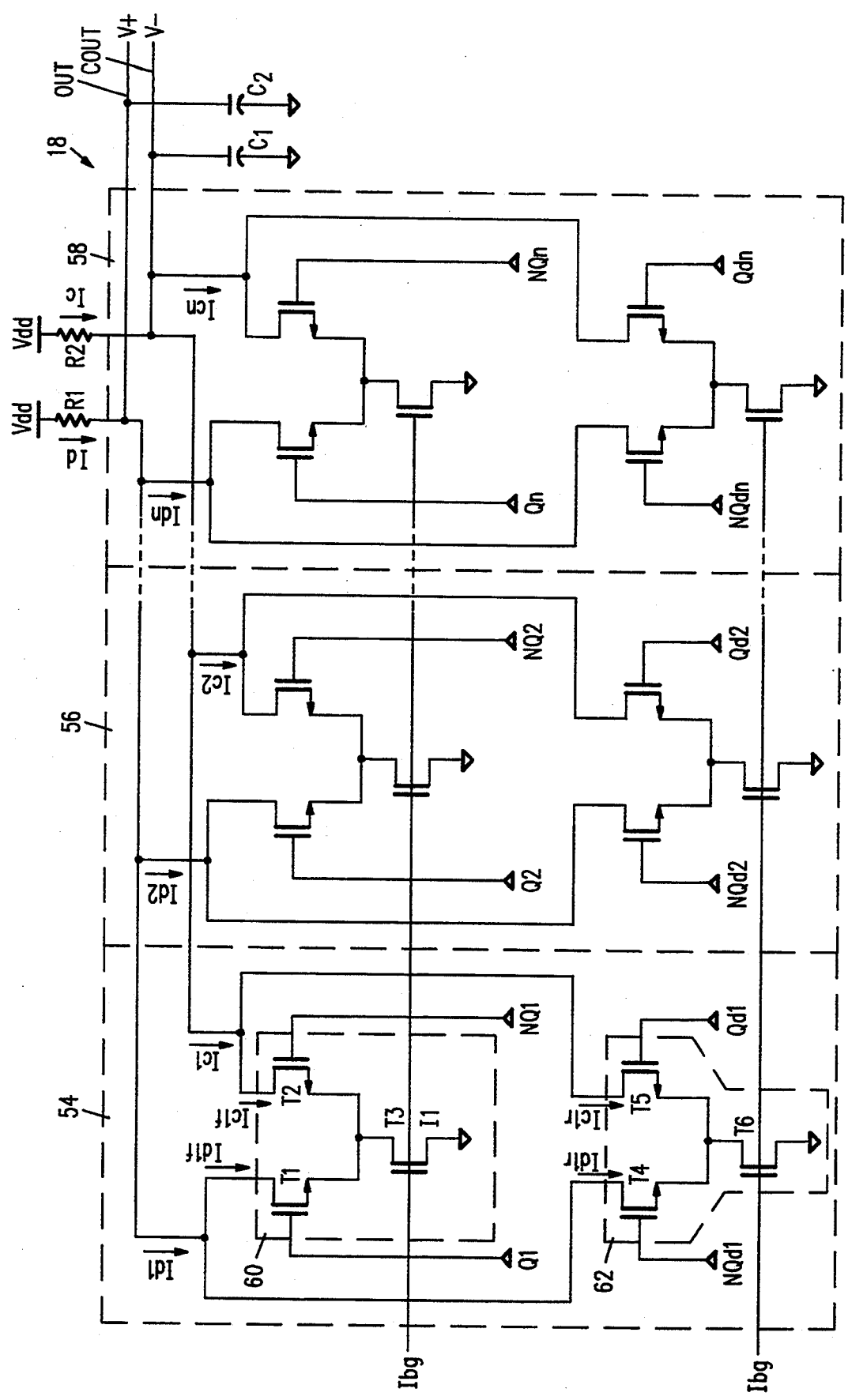
FIG. 7 is a schematic diagram illustrating an embodiment of a weighted current sum stage 18.
Figure 8A:
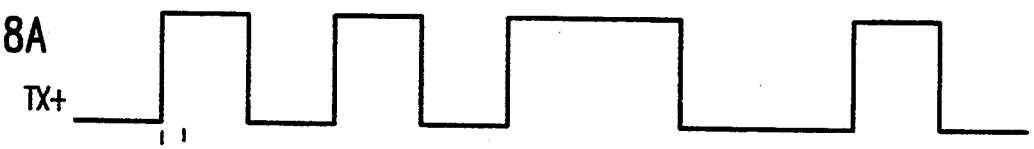
FIGS. 8A–8D are timing diagrams illustrating the input data signal TXO+, the first logic signal Q1, the first delayed logic signal Qdl, and the first complementary delayed logic signal NQdl.
Figure 8B:
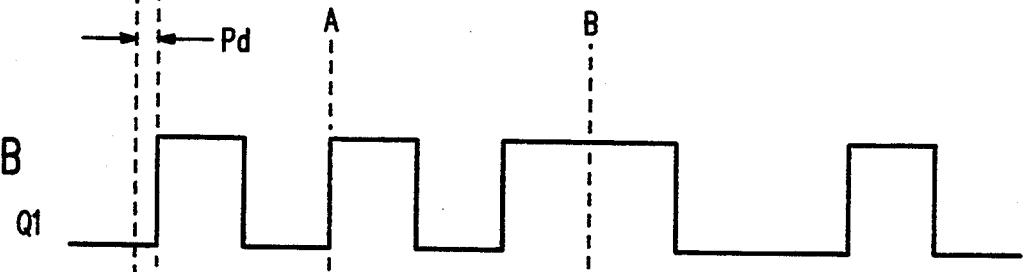
Figure 8C:
Figure 8D:
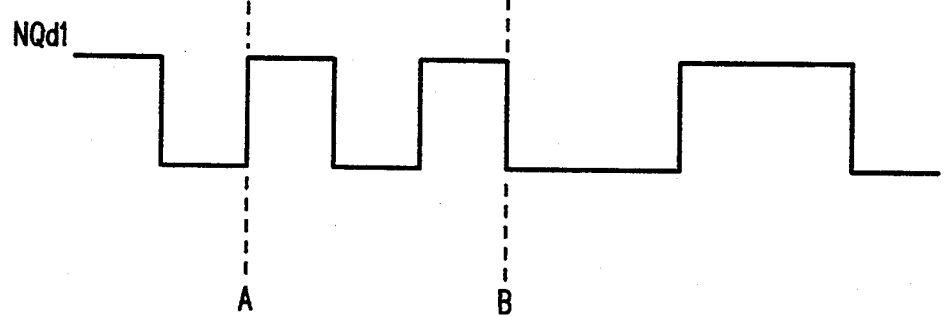

FIG. 7 shows a schematic diagram that illustrates an embodiment of weighted current sum stage 18 in accordance with the parent application. Weighted current sum stage 18 generates the output data signal V+ and the complementary output data signal V− in response to both the plurality of pairs of complementary logic signals Q1/NQ1-Qn/NQn and the plurality of pairs of complementary delayed logic signals Qd1/NQd1-Qdn-NQdn.

Each pair of logic signals Q/NQ and its corresponding pair of delayed logic signals Qd/NQd simultaneously generate both an incremental portion of the output data signal V+ and an incremental portion of the complementary output data signal V−. Thus, the instantaneous value of the output data signal V+ is determined by summing together all the incremental portions of the output data signal V+ while the instantaneous value of the complementary output data signal V− is also determined by summing together all the incremental portions of the complementary output data signal V−.

Weighted current sum stage 18 is illustrated in FIG. 7 as an output resistor R1 connected between a power supply Vdd and an output node OUT, a complementary output resistor R2 connected between the power supply Vdd and a complementary output node COUT, and a series of current sources including a first current source 54, a second current source 56, and a nth current source 58 where the nth current source corresponds to the nth logic signals Qn, NQn, Qdn, and NQdn.

Each current source 54, 56, and 58 generates the portion of the output data signal V+ and the portion of the complementary output data signal V− by sinking either one of a plurality of incremental data currents Id1-Idn through the output resistor R1 or one of a plurality of complementary data currents Ic1-Icn through the complementary output resistor R2, respectively.

The series of incremental data currents Id1-Idn, each of which corresponds to one of the current sources 54, 56, and 58, are illustrated in FIG. 7 as a first incremental data current Id1, a second incremental data current Id2, and a nth incremental data current Idn where the nth incremental data current Idn corresponds to the nth current source 58.

Similarly, the series of complementary incremental data currents Ic1-Icn, each of which also corresponds to one of the current sources 54, 56, and 58, are illustrated in FIG. 7 as a first complementary incremental data current Ic1, a second complementary incremental data current Ic2, and a nth complementary incremental data current Icn where the nth complementary incremental data current Icn corresponds to the nth current source 58.

As shown in FIG. 7, the first current source 54 sinks either the first incremental data current Id1 or the first complementary incremental data current Ic1, the second current source 56 sinks either the second incremental data current Id2 or a second complementary incremental data current Ic2, and the nth current source 58 sinks either the nth incremental data current Idn or the nth complementary incremental data current Icn.

As further shown in FIG. 7, the first current source 54 includes a data differential pair 60 and a delayed differential pair 62. Data differential pair 60 sinks either a first portion Idlf of the first incremental data current Id1 or a first portion Ic1f of the first complementary incremental data current Ic1 while delayed differential pair 62 sinks either a remaining portion Idlr of the first incremental data current Id1 or a remaining portion Ic1r of the first complementary incremental data current Ic1.

First differential pair 60 includes a first n-channel input transistor T1, a first n-channel complementary input transistor T2, and a first tail current transistor T3. As further shown in FIG. 7, input transistor T1 has its source connected to ground through first tail current transistor T3, its drain connected to a power supply Vdd through the output resistor R1, and its gate connected to receive the first logic signal Q1.

Complementary input transistor T2 has its source connected to ground through first tail current transistor T3, its drain connected to the power supply Vdd through the complementary output resistor R2, and its gate connected to receive the first complementary logic signal NQ1. First tail current transistor T3 has its source connected to ground and its gate connected to a bandgap reference current Ibg. First tail current transistor T3 sinks either the first portion Idlf of the first incremental data current Id1 or the first portion Ic1f of the first complementary incremental data current Ic1.

First delayed differential pair 62 includes a first n-channel delayed complementary input transistor T4, a first n-channel delayed input transistor T5, and a first delayed tail current transistor T6. Delayed complementary input transistor T4 has its source connected to ground through first delayed tail current transistor T6, its drain connected to the power supply Vdd through the output resistor R1, and its gate connected to receive the first delayed complementary logic signal NQd1.

First delayed input transistor T5 has its source connected to ground through first delayed tail current transistor T6, its drain connected to the power supply Vdd through the complementary output resistor R2, and its gate connected to receive the first delayed logic signal Qd1. First delayed tail current transistor T6 has its source connected to ground and its gate connected to the bandgap reference current Ibg. First delayed tail current transistor T6 sinks either the remaining portion Idlr of the first incremental data current Id1 or the remaining portion Ic1r of the first complementary incremental data current Ic1. The magnitude of the remaining portions of the incremental currents are approximately one-third the magnitude of the first portions of the incremental currents.

In operation, as stated above, when the logic state of the input data signal TX+ transitions from a logic low to a logic high, each logic signal Q1–Qn will transition to a logic high and each complementary logic signal NQ1–NQn will transition to a logic low after the delay time associated with its corresponding inverter gate and each delayed logic signal Qd1–Qdn will transition to a logic high and each complementary delayed logic signal NQd1–NQdn will transition to a logic low after both the delay time associated with its corresponding inverter gate and the one-half period delay.

When the first logic signal Q1 transitions from a logic low to a logic high and the first complementary logic signal NQ1 transitions from a logic high to a logic low, the gate-to-source voltage of input transistor T1 increases while the gate-to-source voltage of complementary input transistor T2 simultaneously decreases. As the gate-to-source voltage of the input transistor T1 increases and the gate-to-source voltage of complementary input transistor T2 decreases, input transistor T1 begins sinking the first portion Id1f of the first incremental data current Id1 while the complementary input transistor T2 stops sinking the first portion Ic1f of the first complementary incremental data current Ic1.

Similarly, when the first delayed logic signal Qd1 transitions from a logic high to a logic low and the first delayed complementary logic signal NQd1 transitions from a logic low to a logic high, the gate-to-source voltage of delayed input transistor T4 increases while the gate-to-source voltage of complementary delayed input transistor T5 simultaneously decreases. As above, when the gate-to-source voltage of delayed input transistor T4 increases and the gate-to-source voltage of complementary delayed input transistor T5 decreases, delayed input transistor T4 begins sinking the remaining portion Id1r of the first incremental data current Id1 while complementary delayed input transistor T5 stops sinking the remaining portion Ic1f of the first complementary incremental data current Ic1.

Similarly, second current source 56 and the nth current source 58, both of which are configured as first current source 54, begin sinking the second incremental data current Id2 and the nth incremental data current Idn, respectively, through the output resistor R1 and stop sinking the second complementary incremental data current Ic2 and the nth complementary data current Icn, respectively, through the complementary output resistor R2 in response to their corresponding logic signals Q2/NQ2–Qn/NQn.

FIGS. 8A–8D show a timing diagram that illustrates the input data signal TX+, the first logic signal Q1, the first delayed logic signal Qd1, and the first complementary delayed logic signal NQd1. As shown in FIGS. 8A–8D, the first logic signal Q1 is delayed by a first propagation delay time Pd introduced by the first inverter gate 28 (see FIG. 4) while the first delayed logic signal Qd1 and the complementary delayed transmit logic signal NQd1 are delayed by the first propagation delay time Pd and the one-half period delay Ph.

As further shown in FIGS. 8A–8D, at time A, when the logic state of the first logic signal Q1 transitions from a logic low to a logic high, the complementary delayed logic signal NQd1 also transitions from a logic low to a logic high. Thus, at time A, both input transistor T1 and delayed input transistor T4 turn on to sink both the first portion Id1f and the remaining portion Id1r of the first incremental data current Id1.

As further shown in FIGS. 8A–8D, at time B, the logic state of the first complementary delayed logic signal NQd1 transitions from a logic high to a logic low while the logic state of the first logic signal Q1 remains high. Thus, at time B, input transistor T1 remains on while delayed input transistor T4 turns off.

Figure 1:
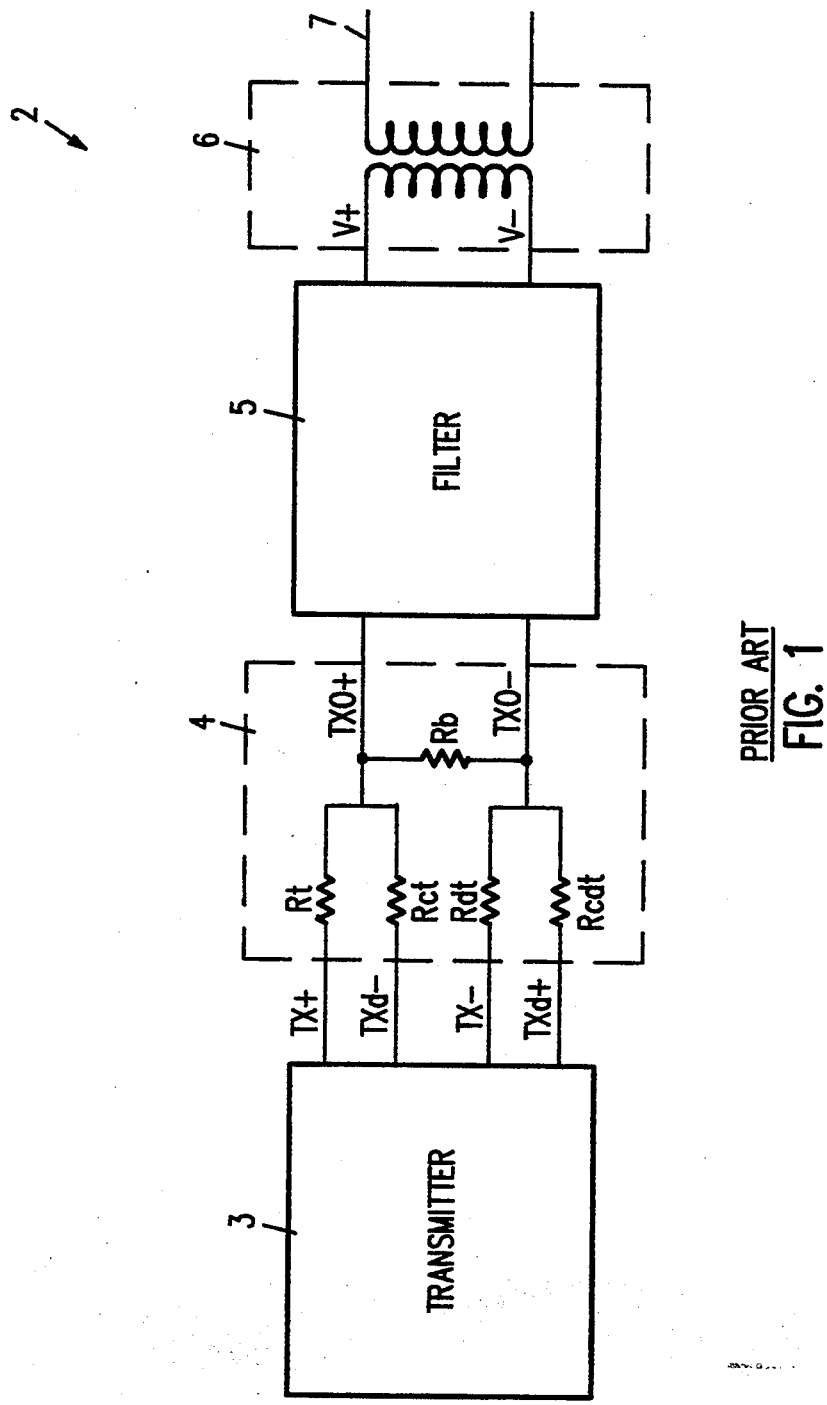
FIG. 1 is a block diagram illustrating a commonly utilized circuit 2 for resistively combing and filtering the input data signals TX+, TX−, TXd+, and TXd−.
Figure 2A:
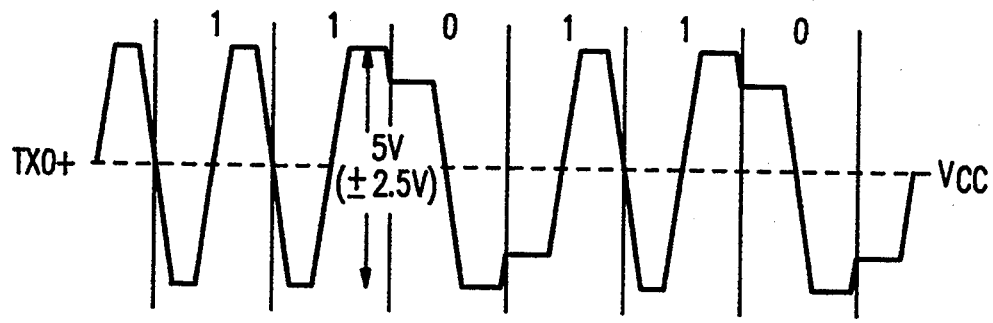
FIGS. 2A–C are a waveform diagram illustrating an example of the transmit voltage signal TXO+, the complementary transmit voltage signal TXO−, and the transmitted waveform Tw.
Figure 2B:
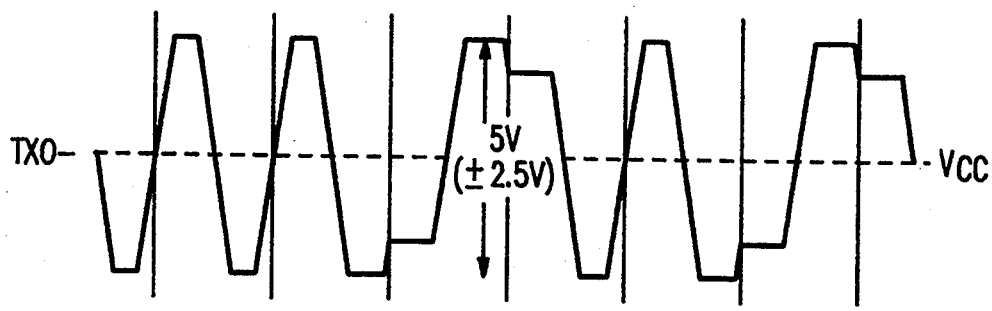
Figure 2C:
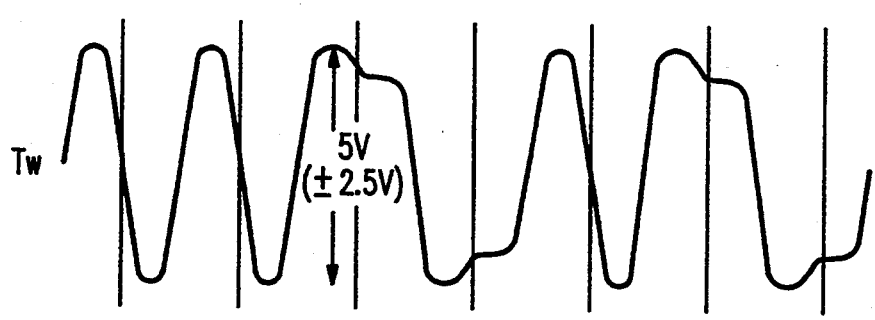

Since the magnitude of the remaining portion of the first incremental data current Id1 is approximately one-third the magnitude of the first portion of the first incremental data current Id1, as delayed input transistor T4 of each of the current sources sequentially turns off prior to the input transistor T1, a defined amplitude step (see FIGS. 2A–C) is formed in accordance with the IEEE 802.3 specification.

Thus, as the first and each succeeding pair of logic signals sequentially change logic state, an additional incremental current will be sunk through the output resistor R1, thereby producing a decreasing output data signal V+, while a reduced incremental current will be sunk through the complementary output resistor R2, thereby producing an increasing complementary output data signal V−.

Figure 9A:
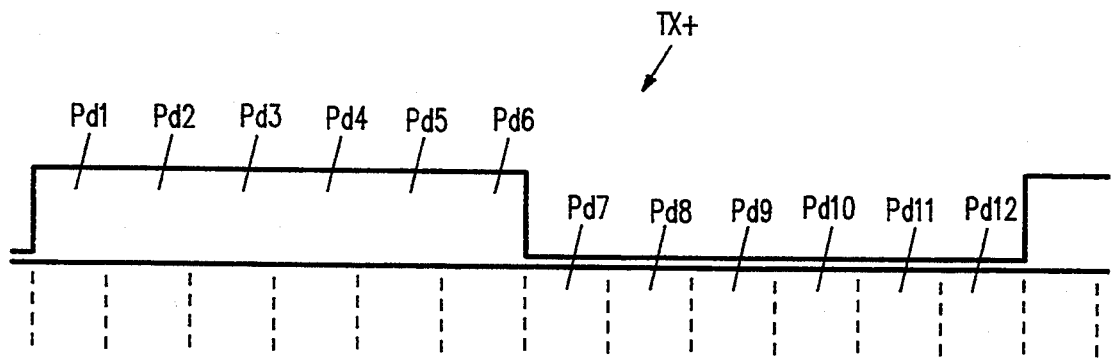
FIGS. 9A and 9B are a graphical representation illustrating the conceptual operation of weighted current sum stage 18.
Figure 9B:
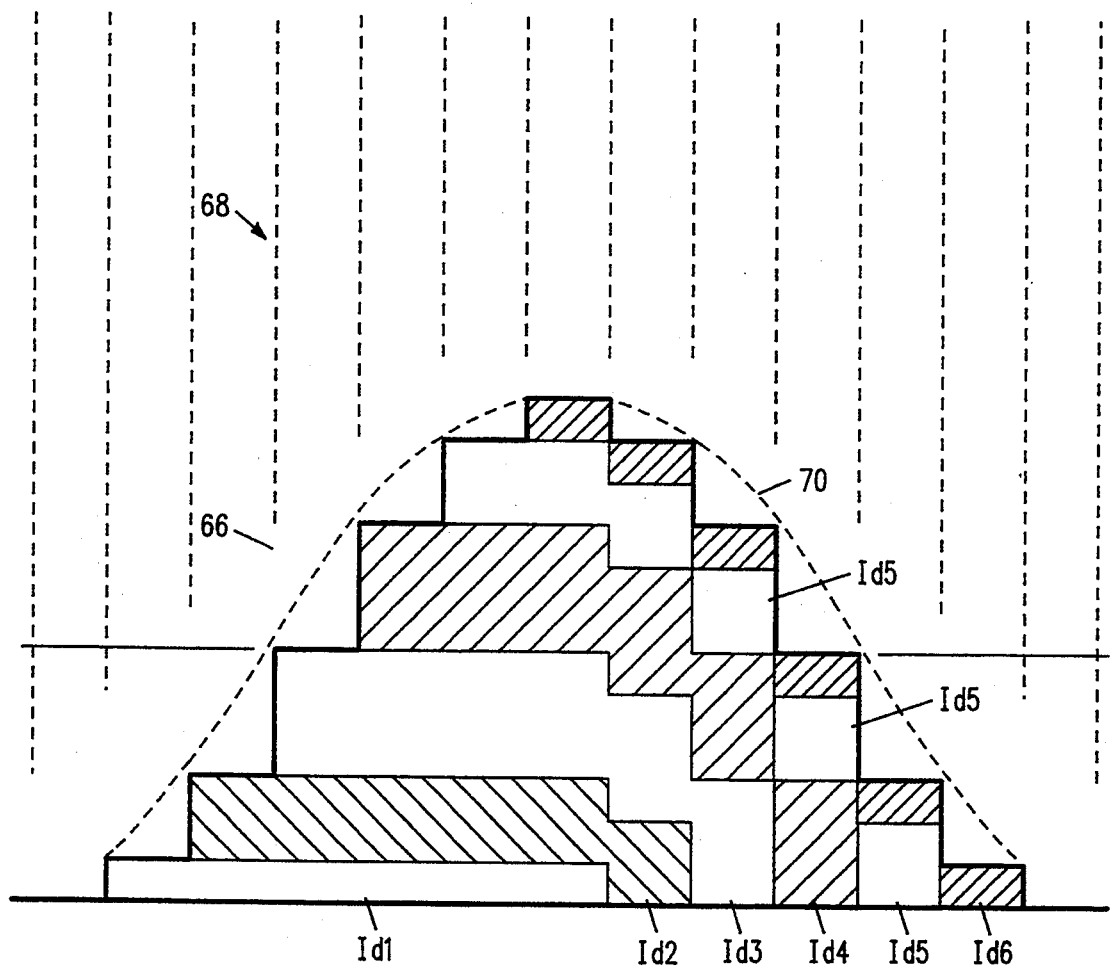

FIGS. 9A and 9B graphically show an example of the operation of current summing stage 18 based on one half the number of incremental currents and propagation delay periods as utilized in the preferred embodiment. FIG. 9A shows an example of one period of the input data signal TX+ which has been divided into twelve propagation delay periods Pd1–Pd12. As derived from the above, the twelve propagation delay periods Pd1–Pd12 result from utilizing six inverter gates generating 24 transmit logic signals to 6 logic blocks which generate 6 incremental data currents Id1–Id6 and 6 incremental complementary data currents Ic1–Ic6. In the FIG. 9B example, only the operation of the incremental data currents Id1–Id6 are illustrated.

FIG. 9B shows a resulting waveform which is created by incrementally adding and subtracting the six incremental data currents Id1–Id6. As graphically shown in the FIG. 9B example, after the first propagation delay period Pd1, a first incremental data current Id1 represented by one unit of current is generated. As stated above, the first incremental data current Id1 and each of the six succeeding incremental data currents Id2–Id6 are generated for a period of time which is equivalent to one half the period of the input data signal TX+.

After a second propagation delay period Pd2, a second incremental data current Id2 represented by two additional units of additional current is generated. As is graphically depicted in FIG. 9B, the second incremental data current Id2 is added to the first incremental data current Id1. Thus, after the second propagation delay period Pd2, the total data current is represented by three units of current.

After a third propagation delay period Pd3, a third incremental data current Id3 represented by three additional units of current are generated and added to the previous units of current. Thus, after the third propagation delay period Pd3, the total data current is represented by six units of current.

Similarly, after a fourth propagation delay period Pd4, a fifth propagation delay period Pd5, and a sixth propagation delay period Pd5, a fourth, a fifth, and a sixth incremental data currents Id4, Id5, and Id6, respectively, are generated. The fourth, the fifth, and the sixth incremental data currents Id4, Id5, and Id6, which are represented by three additional units, two additional units, and one additional unit of current, respectively, are added to the previous units of current.

Thus, after the sixth propagation delay period Pd6, the total data current is represented by 12 units of current. Therefore, by adding the incremental units of current together, the rising edge 66 of a stepped sine wave 68 is formed.

As further shown in FIG. 9B, after the seventh propagation delay period Pd7, the first incremental data current Id1 is terminated and subtracted from the total data current. Thus, after the seventh propagation delay period Pd7, the total data current is represented by 11 units of current.

Similarly, after the eight propagation delay period Pd8, the second incremental data current Id2 is terminated and subtracted from the total data current. Thus, after the eight propagation delay period Pd8, the total data current is represented by 9 units of current. Therefore, as can be seen in FIG. 9B, a falling edge 70 of the stepped sine wave 68 is formed from the termination of each incremental data current.

As can be seen in FIG. 9B, by increasing both the number of propagation delay periods, and therefore the number of incremental data currents, a more defined sine wave 68 can be generated whereas by reducing both the number of propagation delay periods and the number of incremental data currents, a less defined sine wave 68 can be generated. Thus, the number of propagation delay periods and the number of incremental data currents selected is dependent on the required quality of resulting sine wave 68.

Testing of weighted current sum stage 18 indicates that a minimum of eight incremental currents and sixteen propagation delay periods are required to define the resulting sine wave in accordance with the IEEE 802.3 standard. In the preferred embodiment, 12 incremental currents and 24 propagation delay periods are utilized.

Referring again to FIG. 7, the output capacitor C1 and the complementary output capacitor C2, both of which function as low-pass filters, smooth out the stepped sine wave 68 to produce the output data signal V+ and the complementary output data signal V−.

Thus, in accordance with the parent application, waveshaping circuit 10 transforms the input data signal TX+ and the delayed input data signal TXd+ into a pair of complementary sinusoidal output waveforms V+ and V−, as defined by the IEEE 802.3 local area network 10BASE-T specification, without the use of external waveshaping components. As a result, the size, cost, emissions, and complexity of a 10BASE-T installation can be reduced.

As described above, the function of phase-lock-loop 12 is to generate a series of edges that fall within the pulse widths of the input data signal TX+ and the delayed input data signal TXd+. Since the input data signal TX+ has a fixed phase relationship with the oscillator signal OSC, phase-lock-loop 12 is configured to generate the series of incrementally-delayed timing signals TS1-TSn so that the leading edge of each timing signal TS1-TSn has a fixed phase relationship with the oscillator signal OSC. As a result, the leading edges of the timing signals TS1-TSn also have a fixed phase relationship with the input data signal TX+. Further, since the delayed input data signal TXd+ has a fixed phase relationship with the input data signal TX+, the timing signals TS1-TSn also have a fixed phase relationship with the delayed input data signal TXd+.

As further stated above, although the phase-lock-loop circuitry provided a series of edges that fall within the pulse widths of the input data signal TX+ and the delayed input data signal TXd+, phase-lock-loops in general consume a relatively large amount of silicon real estate and are subject to varying degrees of instability as a result of transients, temperature variations, and other related conditions.

Therefore, in the present invention, rather than utilizing phase-lock-loop 12 and the oscillator signal OSC to generate the series of edges, as represented by the timing signals TS1-TSn, by phase adjusting the input data signal TX+, the edges of an oscillator signal can be utilized as the series of edges. As a result, the need for a phase-lock-loop can be eliminated.

Figure 10:
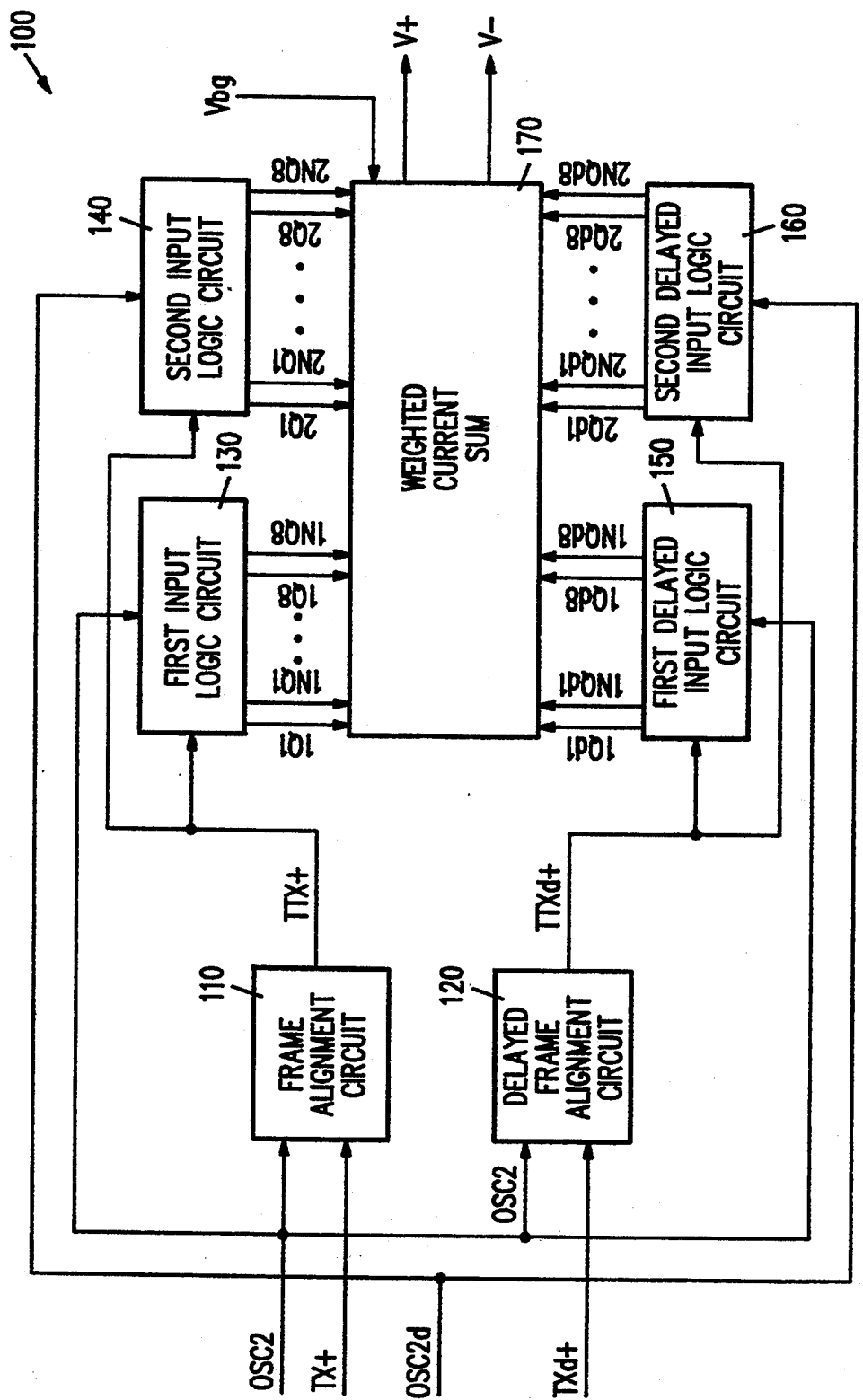
FIG. 10 is a block diagram illustrating a waveshaping circuit 100 in accordance with the first alternative embodiment.

FIG. 10 shows a block diagram of a waveshaping circuit 100 in accordance with the present invention. As shown in FIG. 10, waveshaping circuit 100 includes a frame alignment circuit 110 that generates a phase-adjusted input signal TTX+ by fixing a phase relationship between the input data signal TX+ and an externally-generated oscillator signal OSC2.

Figure 11:
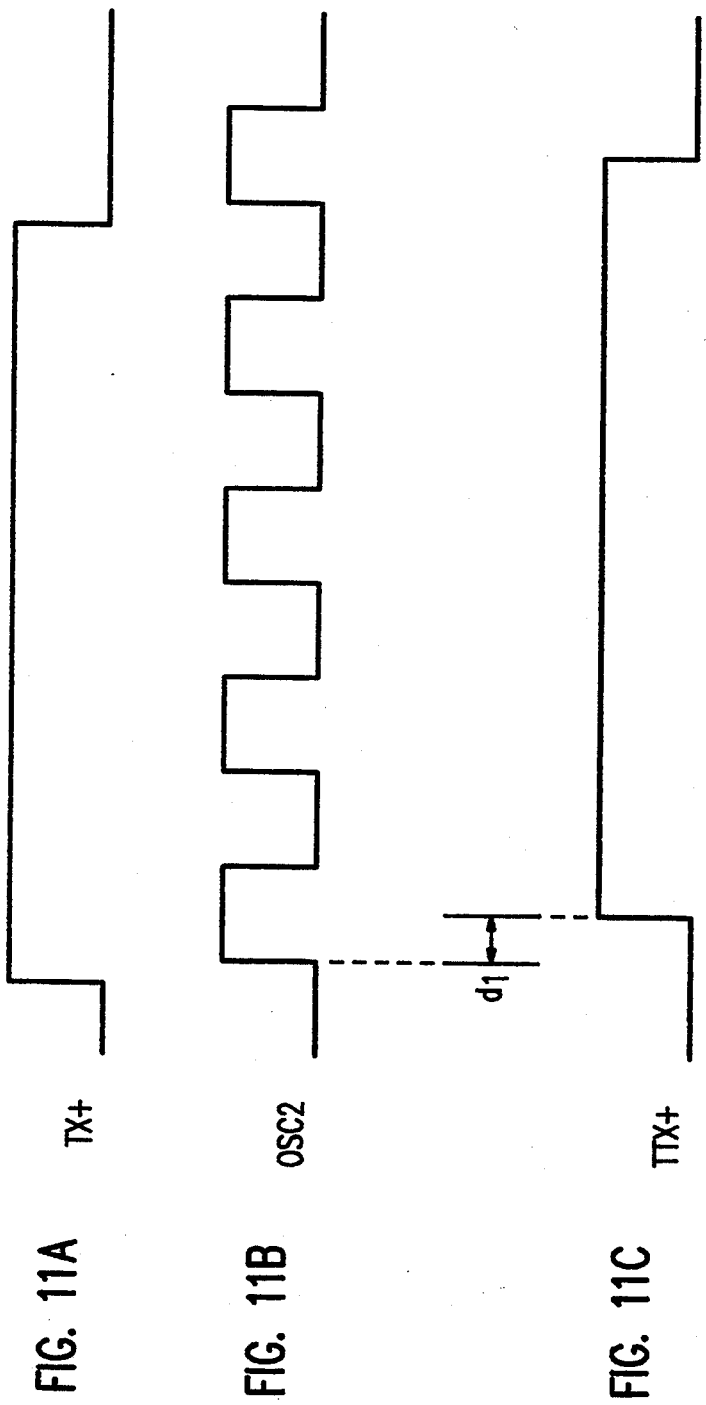
FIG. 11A–11C are timing diagrams illustrating the operation of frame alignment circuit 110.

FIGS. 11A-11C show a timing diagram which illustrates the operation of frame alignment circuit 110. As shown in FIGS. 11A-11C, it is assumed that there is no defined phase relationship between the input data signal TX+ and the oscillator signal OSC2. As further shown in FIGS. 11A-11C, the period of the oscillator signal OSC2 is set to be a multiple of the period of the input data signal TX+. As a result, a defined number of oscillator periods equal the period of the input data signal TX+.

By then phase delaying the input data signal TX+ a delay time $d_1$ with respect to one of the rising edges of the oscillator signal OSC2, and by utilizing both the rising and falling edges of the oscillator signal OSC2, a predetermined number of edges can be generated within the pulse width of a phase-aligned input signal TTX+ which have a defined phase relationship with respect to the leading edge of the phase-aligned input signal TTX+.

In the preferred embodiment, the oscillator signal OSC2 is implemented as an 80 MHz oscillator signal. As a result, four 12.5 nS clock periods can be fit within one-half of the period of the input data signal TX+ which, as stated above, is 50 nS. By then utilizing the falling edges as well as the rising edges, a total of eight edges can be generated within the pulse width. Alternatively, other variations of the delay time $d_1$ and the period of the oscillator signal OSC2 can be used to generate a greater or lesser number of edges within the pulse width of the input data signal TX+.

Figure 12:
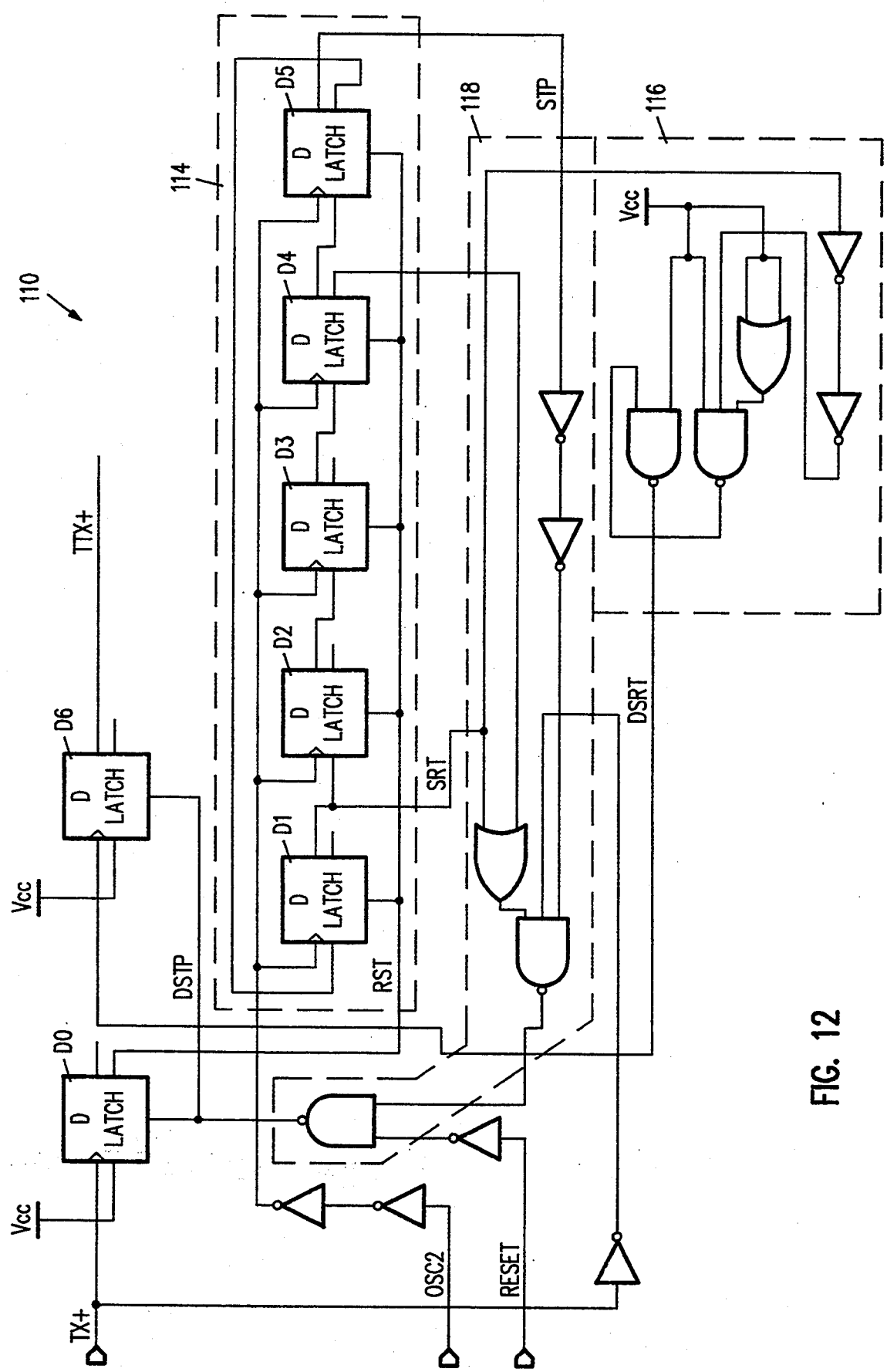
FIG. 12 is a schematic diagram illustrating frame alignment circuit 110.

FIG. 12 shows a schematic diagram that illustrates frame alignment circuit 110. As shown in FIG. 12, frame alignment circuit 110 includes a D latch D0 that latches a logic low at its inverting output as a reset signal RST in response to the rising edge of the input data signal TX+, and that resets the reset signal RST to a logic high in response to the rising edge of a delayed stop signal DSTP.

Frame alignment circuit 110 also includes a delay line 114 that generates a start frame signal SRT with a low logic state and a stop frame signal STP with low logic state when the reset signal RST is a logic high, that changes the logic state of the start frame signal SRT to a logic high in response to the first rising edge of the oscillator signal OSC2 that occurs after the rising edge of the input data signal TX+, and that changes the logic state of the stop frame signal STP to a logic high in response to the fifth rising edge of the oscillator signal OSC2.

As further shown in FIG. 12, delay line 114 includes five D latches D1–D5 which are connected together in a feedback configuration so that the D input of latch D1 is connected to the inverting output of latch D5, and so that the D-inputs of latches D2–D5 are connected to the non-inverting outputs of latches D1–D4, respectively. In addition, the reset inputs and the clock inputs of each of the latches D1–D5 are connected to the reset signal RST and the oscillator signal OSC2, respectively.

Frame alignment circuit 110 also includes a delay circuit 116 that delays the start signal SRT a first delay time to generate a delayed start signal DSRT. Thus, when the start signal SRT transitions from a logic low to a logic high, the delayed start signal DSRT transitions from a logic low to a logic high the first delay time later.

Similarly, frame alignment circuit 110 also includes a delay circuit 118 that generates the delayed stop signal DSTP by delaying the stop signal STP a second delay time. Thus, when the stop signal STP transitions from a logic low to a logic high, the delayed stop signal DSTP transitions from a logic low to a logic high the second delay time later. In the preferred embodiment of the present invention, the first delay time and the second delay time are equivalent.

Finally, frame alignment circuit 110 includes a D latch D6 that latches a logic high at its non-inverting output to produce the rising edge of the phase-adjusted input signal TTX+ in response to the rising edge of the delayed start signal DSRT, and that resets the non-inverting output to a logic low to produce the falling edge of the phase-adjusted input signal TTX+ in response to the rising edge of the delayed stop signal DSTP.

FIGS. 13A–13F shows a timing diagram that illustrates the operation of frame alignment circuit 110. As shown in FIGS. 13A–13F, when the input data signal TX+ transitions to a logic high, the reset signal RST transitions to a logic low, thereby releasing latches D1–D5 from the reset condition. Thus, at this point, a logic low is present at the non-inverting outputs of latches D1–D5, including the start signal SRT, which is taken from the non-inverting output of latch D1, and the stop signal STP, which is taken from the non-inverting output of latch D5.

Since the D input of latch D1 is connected to the inverting output of latch D5, the start signal SRT is clocked from a logic low to a logic high in response to the rising edge of the first oscillator signal OSC2 that occurs after the rising edge of the input data signal TX+o After the start signal SRT transitions to a logic high, the phase-adjusted input signal TTX+ transitions to a logic high a first delay time $d_1$ later.

With each succeeding rising edge of the oscillator signal OSC2, a logic high is clocked at the non-inverting output of each succeeding latch D2–D5 until the stop signal STP is clocked from a logic low to a logic high by the fifth rising edge of the oscillator signal OSC2. After the stop signal STP transitions to a logic high, the phase-adjusted input signal TTX+ transitions to a logic low the first delay time $d_1$ later.

Figure 14:
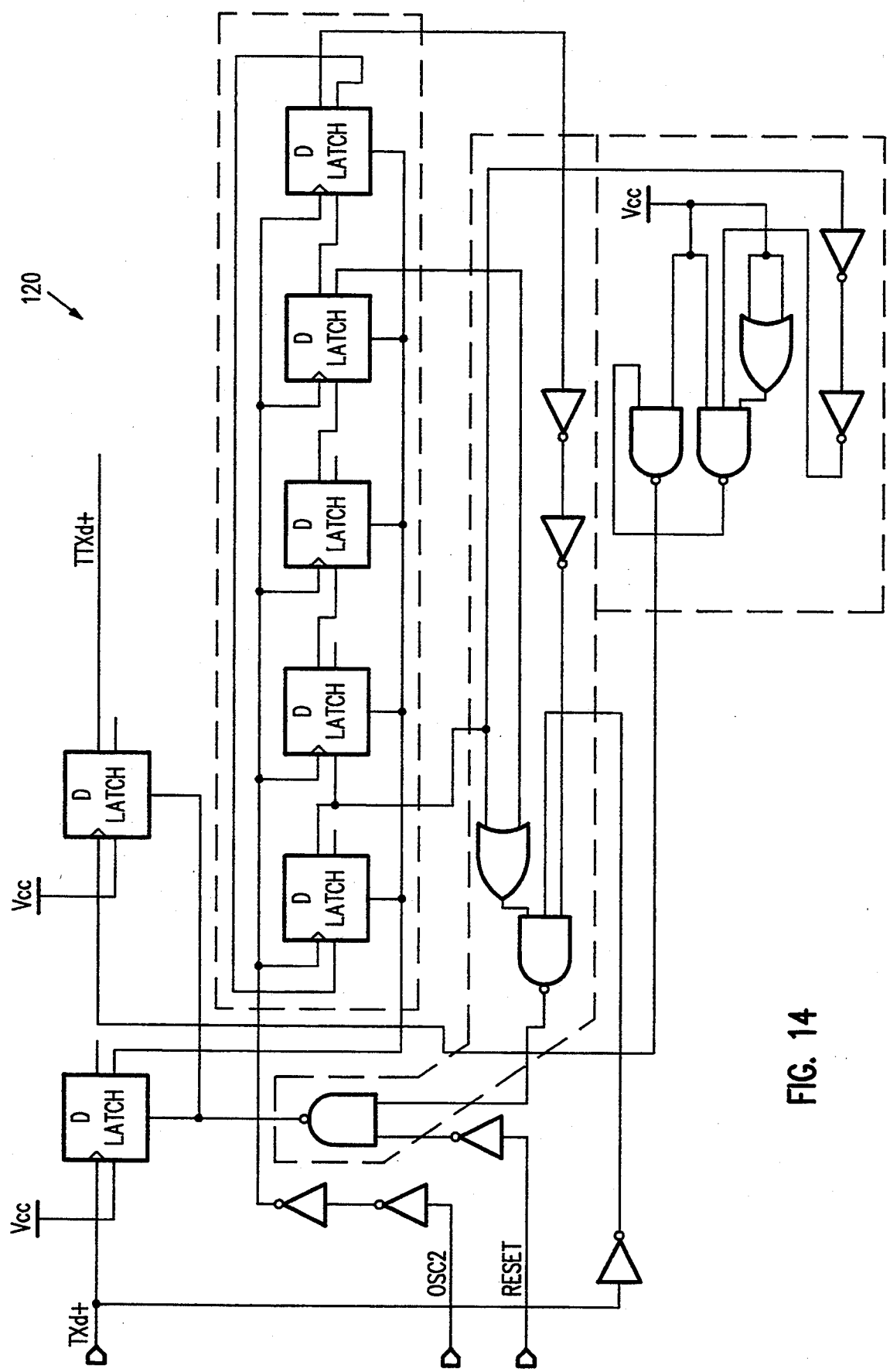
FIG. 14 is a block diagram illustrating delayed frame alignment circuit 120.

Referring again to FIG. 10, waveshaping circuit 100 also includes a delayed frame alignment circuit 120 that generates a phase-adjusted delayed input signal TTXd+ by fixing a phase relationship between the delayed input signal TXd+ and the oscillator signal OSC2. FIG. 14 shows a block diagram that illustrates delayed frame alignment circuit 120. As can be seen in FIG. 14, delayed frame alignment circuit 120 is identical to frame alignment circuit 110 and therefore operates as described above.

Figure 15:
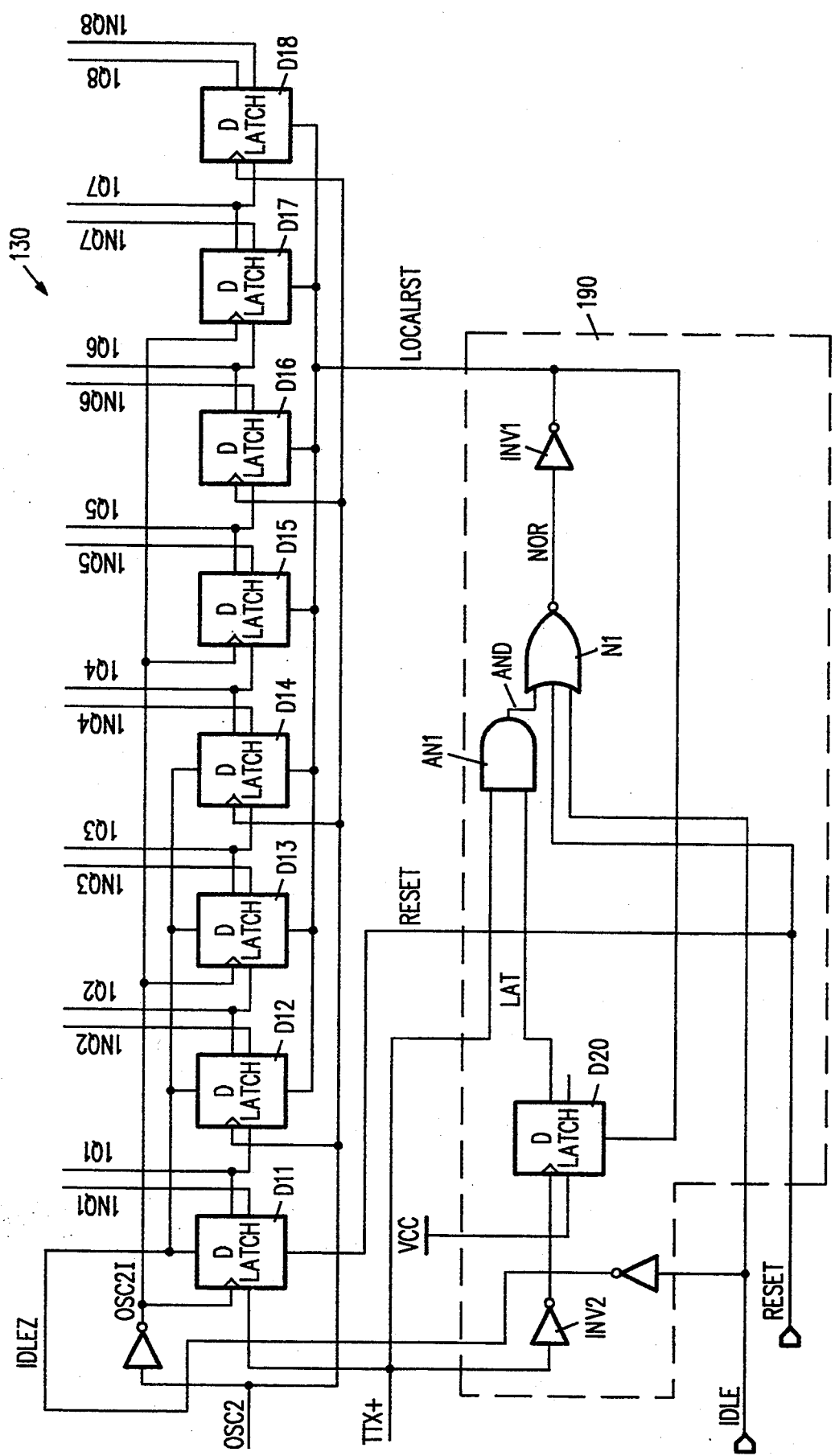
FIG. 15 is a schematic diagram illustrating first input logic stage 130.
Figure 16:
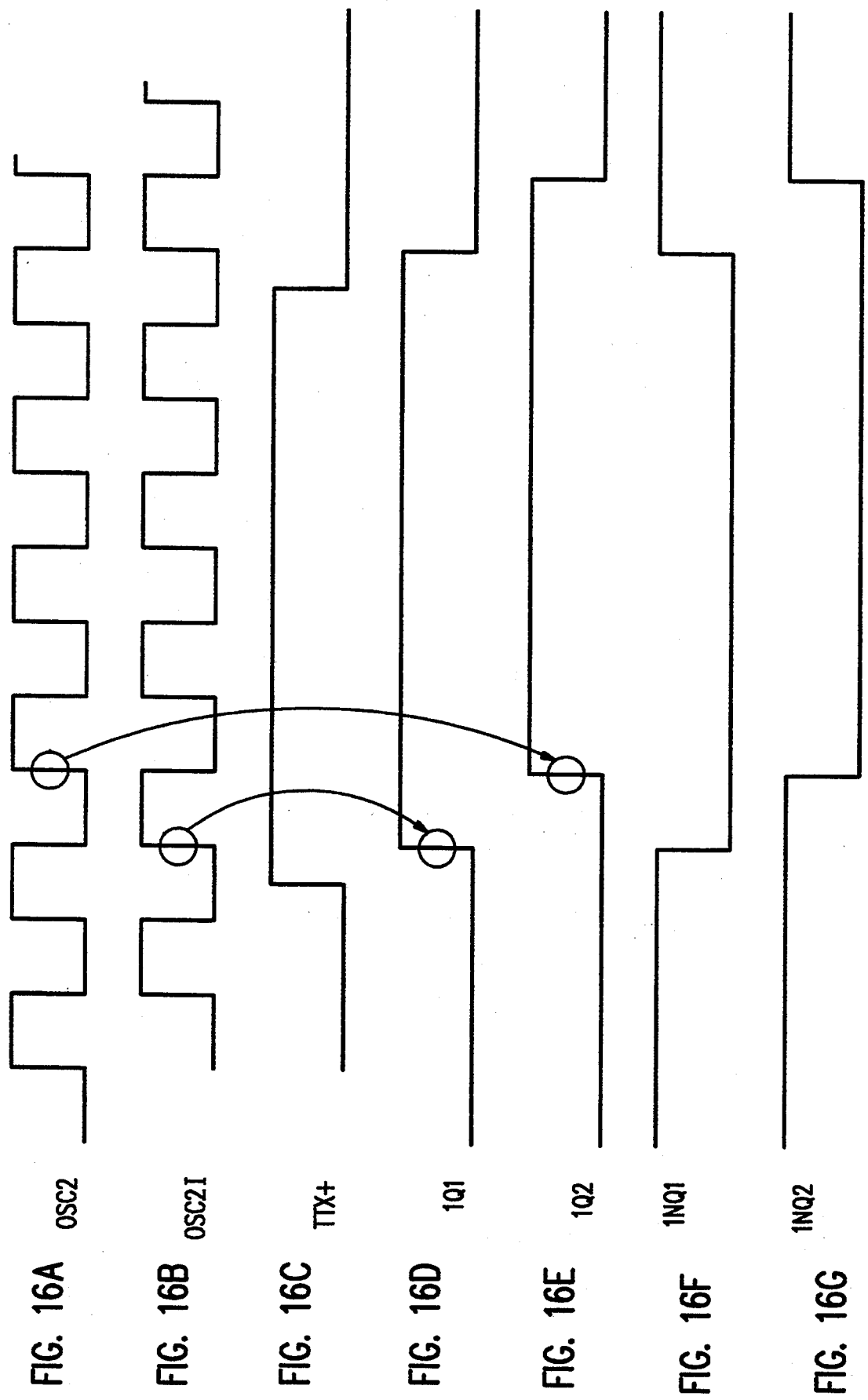
FIGS. 16A-16G are timing diagrams illustrating the operation of first input logic stage 130.

Waveshaping circuit 100 also includes a first input logic stage 130 that generates a series of pairs of logic signals 1Q1/1NQ1–1Q8/1NQ8 so that each pair of logic signals Q/NQ changes to a first pair of logic states in response to one of the edges of the oscillator signal OSC2 that follows the leading edge of the phase-adjusted input signal TTX+, and changes to a second pair of logic states in response to one of the edges of the oscillator signal OSC2 that follows the trailing edge of the phase-adjusted input signal TTX+. FIG. 15 shows a schematic diagram that illustrates first input logic stage 130.

As shown in FIG. 15, first input logic stage 130 includes eight D-latches D11–D18 which are connected together in a shift-right configuration so that the D-input of latch D11 is connected to the phase-adjusted input signal TTX+, and so that the non-inverting outputs of latches D11–D17 are connected to the D-inputs of latches D12–D18, respectively.

In addition, the oscillator signal OSC2 is connected to each even-numbered latch D12, D14, D16, and D18 while an inverted oscillator signal OSC2I is connected to each odd-numbered latch D11, D13, D15, and D17. FIGS. 16A–16G shows a timing diagram that illustrates the operation of first input logic stage 130.

As shown in FIGS. 16A–16G, when the phase-adjusted input signal TTX+ transitions to a logic high, the logic signal 1Q1 transitions to a logic high while the logic signal 1NQ1 transitions to a logic low in response to the first rising edge of the inverted oscillator signal OSC2 that follows. Similarly, the logic signal 1Q2 transitions to a logic high while the logic signal 1NQ2 transitions to a logic low in response to the first rising edge of the oscillator signal OSC2 that follows.

Thus, when the phase-adjusted input signal TTX+ transitions from a logic low to a logic high, latches D11, D13, D15, and D17 latch a logic high and a logic low as logic signals 1Q1/1NQ1, 1Q3/1NQ3, 1Q5/1NQ5, and 1QT/1NQT, respectively, with the first, second, third, and fourth falling edges, respectively, of the oscillator signal OSC2 that follow the transition of the phase shifted input signal TTX+.

Similarly, latches D12, D14, D16, and D18 latch a logic high and a logic low as logic signals Q2/1NQ2, 1Q4/1NQ4, 1Q6/1NQ6, and 1Qe/1NQ8, respectively, with the first, second, third, and fourth rising edges, respectively, of the oscillator signal OSC2 that follow the transition of the phase-adjusted input signal TTX+.

Referring again to FIG. 10, waveshaping circuit 100 also includes a second input logic stage 140, a first delayed input logic stage 150, and a second delayed input logic stage 160. As shown in FIG. 10, logic stage 140 generates the series of pairs of complementary logic signals 2Q1/2NQ1–2Q8/2NQ8 in response to the phase-aligned input signal TTX+ and a delayed oscillator signal OSC2d while logic stages 150 and 160 generate the series of pairs of delayed complementary logic signals 1Qd1/1NQd1–1Qd8/1NQd8 and 2Qd1/2NQd1-2Qd8/2NQd8, respectively, in response to the oscillator signal OSC2 and the delayed oscillator signal OSC2d, respectively, and the delayed phasealigned input signal TTXd+.

As above, each pair of logic signals Q/NQ within the first series of pairs of logic signals 1Q1/1NQ1-1Q8/1NQ8 corresponds with one pair of logic signals within the first series of pairs of logic signals 1Qd1/1NQd1-1Qd8/1NQd8. Similarly, each pair of logic signals Q/NQ within the second series of pairs of logic signals 2Q1/2NQ1-2Q8/2NQ8 corresponds with one pair of logic signals within the second series of pairs of logic signals 2Qd1/2NQd1-2Qd8/2NQd8.

Figure 17:
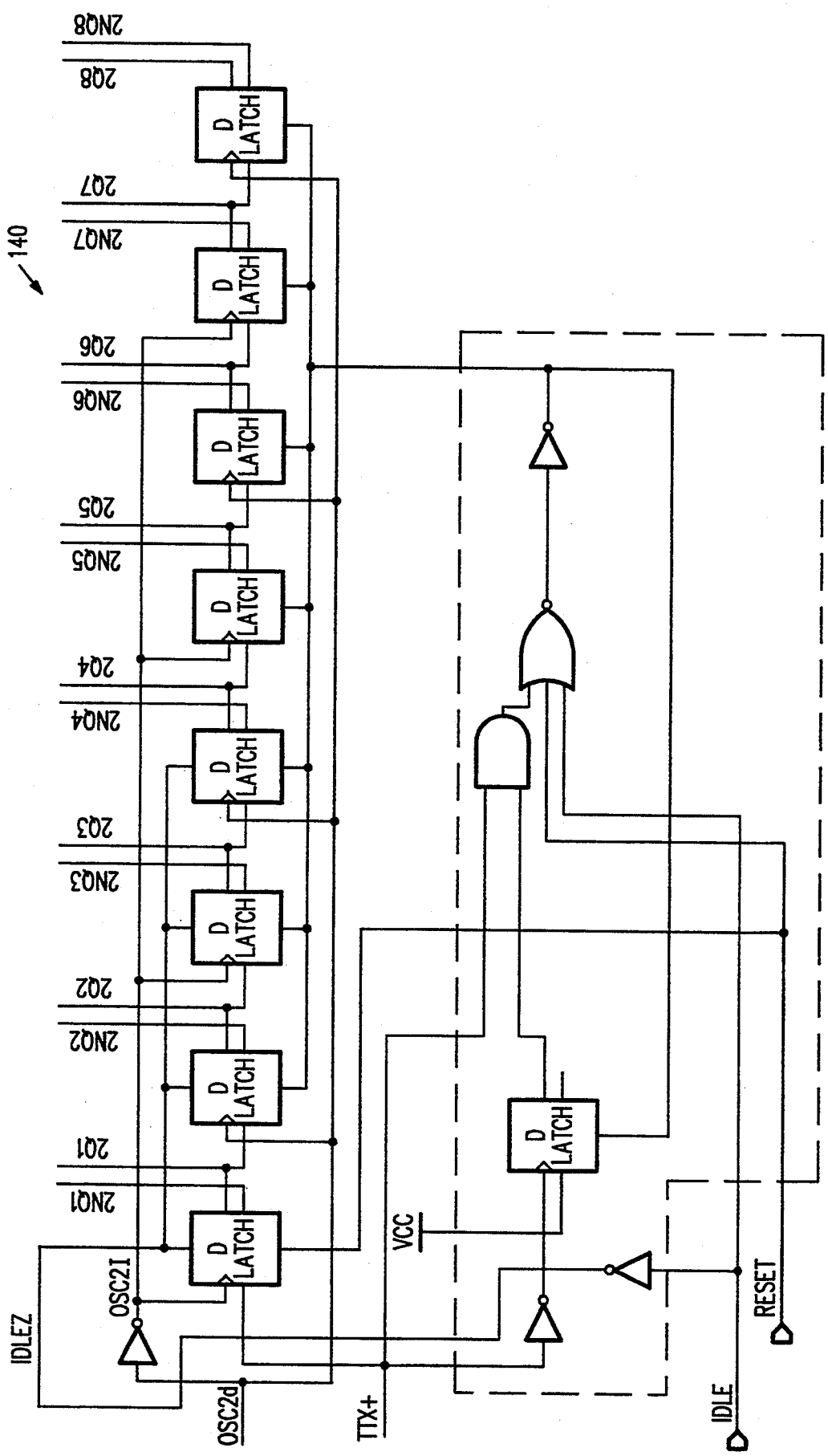
FIGS. 17, 18, and 19 are block diagrams illustrating second input logic stage 140, first delayed input logic stage 150, and second delayed input logic stage 160.
Figure 18:
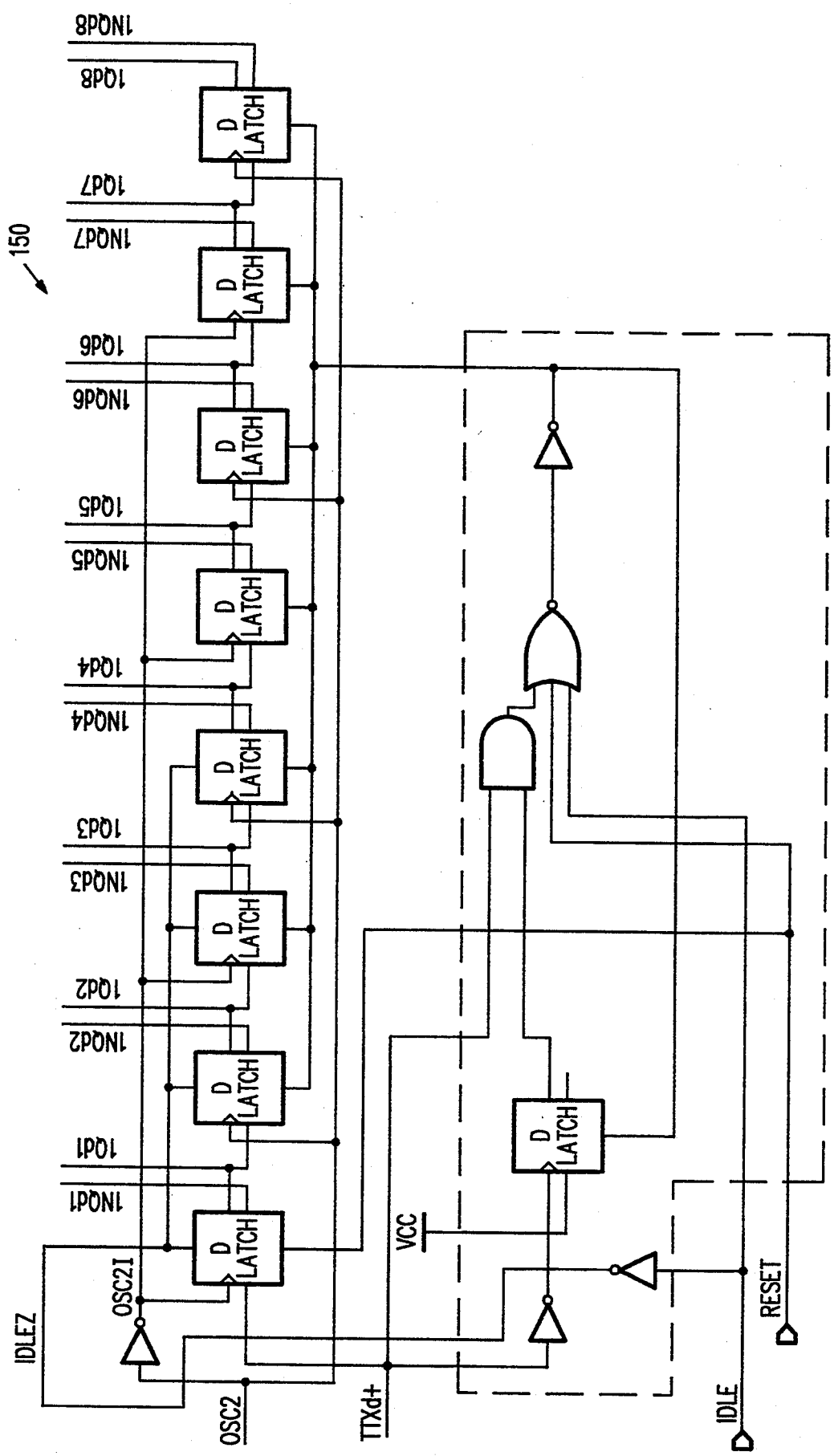
Figure 19:
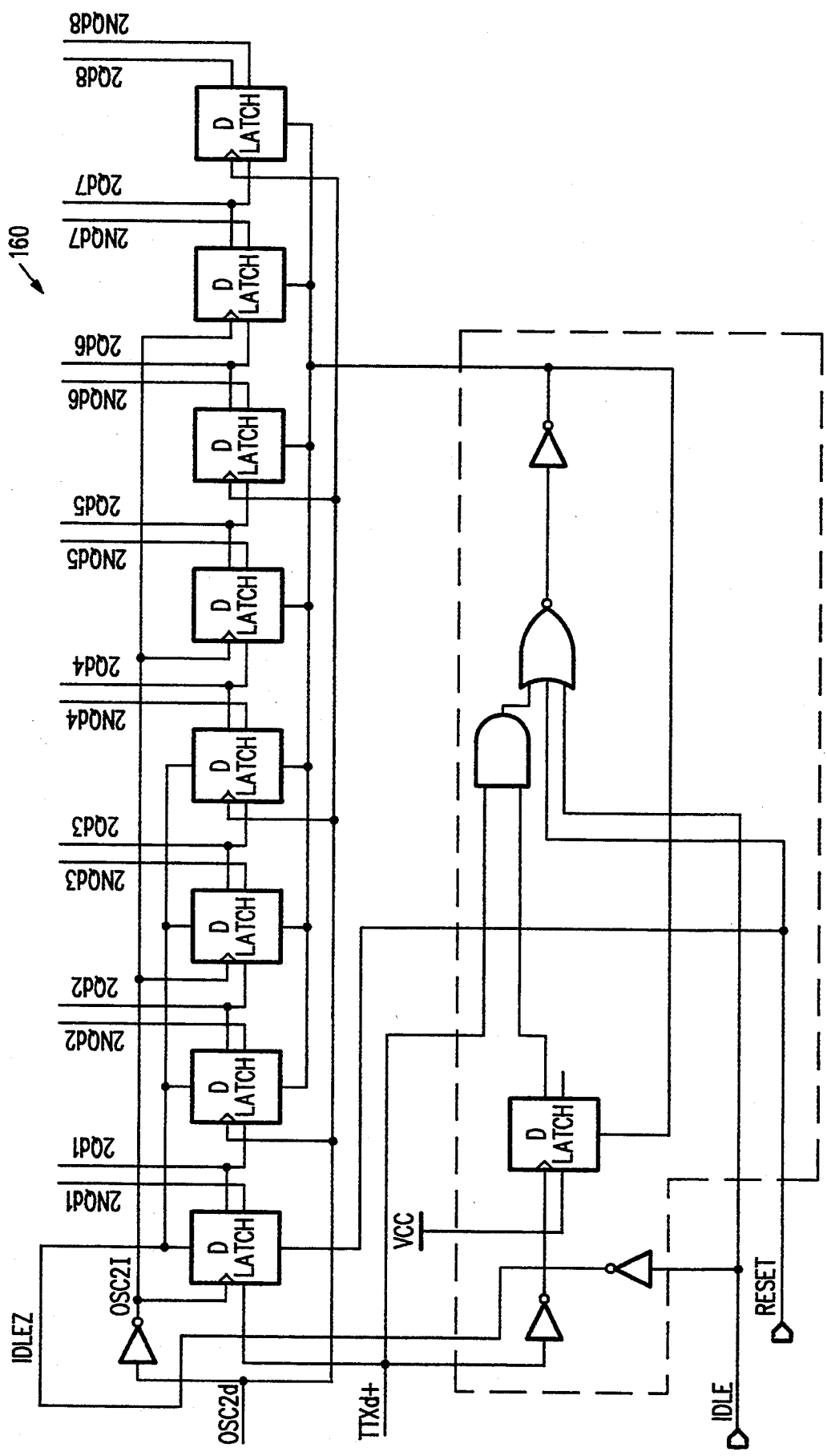
Figure 20:
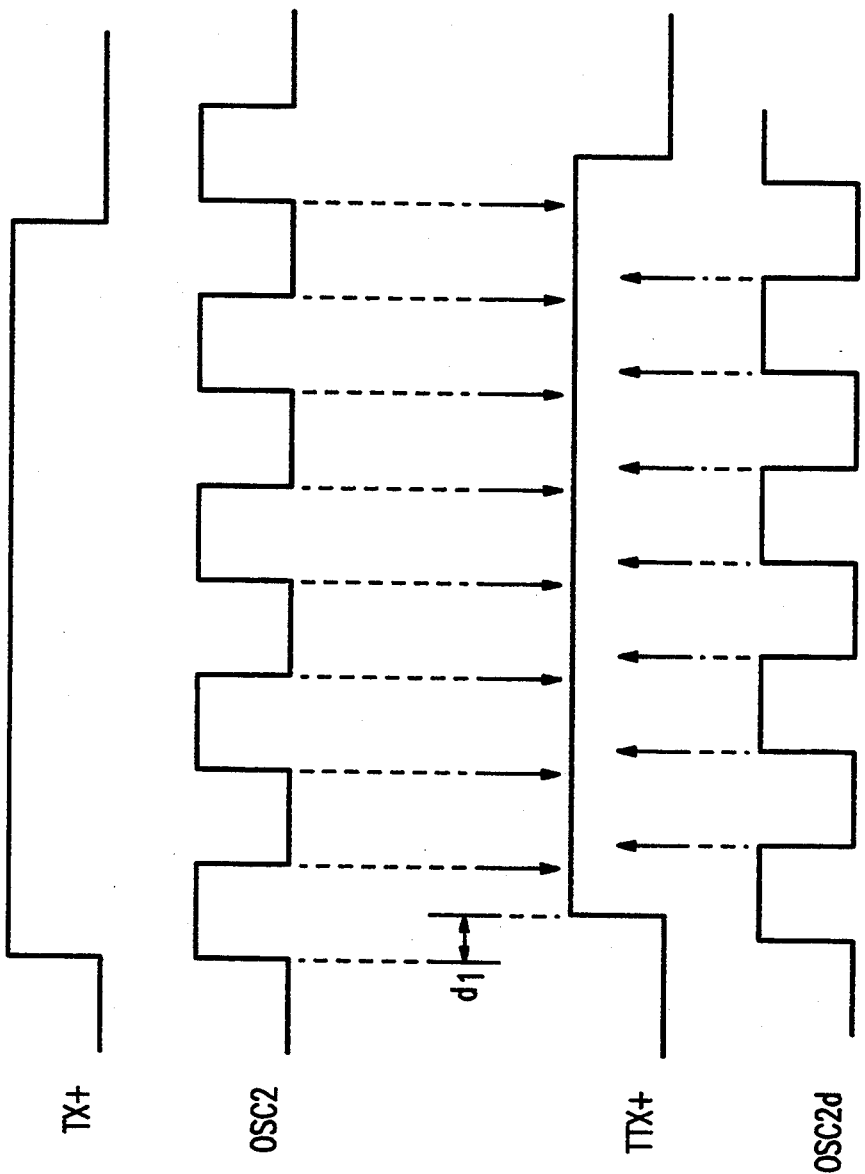
FIGS. 20A-20D are timing diagrams illustrating the use of a delayed oscillator signal OSC2d.

FIGS. 17, 18, and 19 show a block diagram that illustrates second input logic stage 140, first delayed input logic stage 150, and second delayed input logic stage 160. As can be seen in FIGS. 17, 18, and 19, second input logic stage 140, first delayed input logic stage 150, and second delayed input logic stage 160 are identical to first input logic stage 130 and therefore operate as described above.

As stated above, the second input logic stage 140 and the second delayed input logic stage 160 utilize a delayed oscillator signal OSC2d. FIGS. 20A-20D show a timing diagram that illustrates the use of a delayed oscillator signal OSC2d. As shown in FIGS. 20A-20D, by using the delayed oscillator signal OSC2d in addition to oscillator signal OSC2, an additional eight edges can be generated within the pulse width of the input data signal TX+, thereby improving the resolution of the output waveforms V+ and V−.

Although waveshaping circuit 100 utilizes second input logic stage 140 and second delayed input logic stage 160 to provide an additional eight edges within the pulse widths of the input data signal TX+ and the delayed input data signal TXd+, waveshaping circuit 100 can also function without the use of second input logic stage 140 and second delayed input logic stage 160.

As further shown in FIG. 10, waveshaping circuit 100 further includes a weighted current sum stage 170 that generates the pair of complementary output waveforms V+ and V− in response to the plurality of pairs of complementary logic signals 1Q1/1NQ1-1Q8/1NQ8, 2Q1/2NQ1-2Q8/2NQ8, 1Qd1/1NQd1-1Qd8-1NQd8 and 2Qd1/2NQd1-2Qd8-2NQd8.

Figure 21:
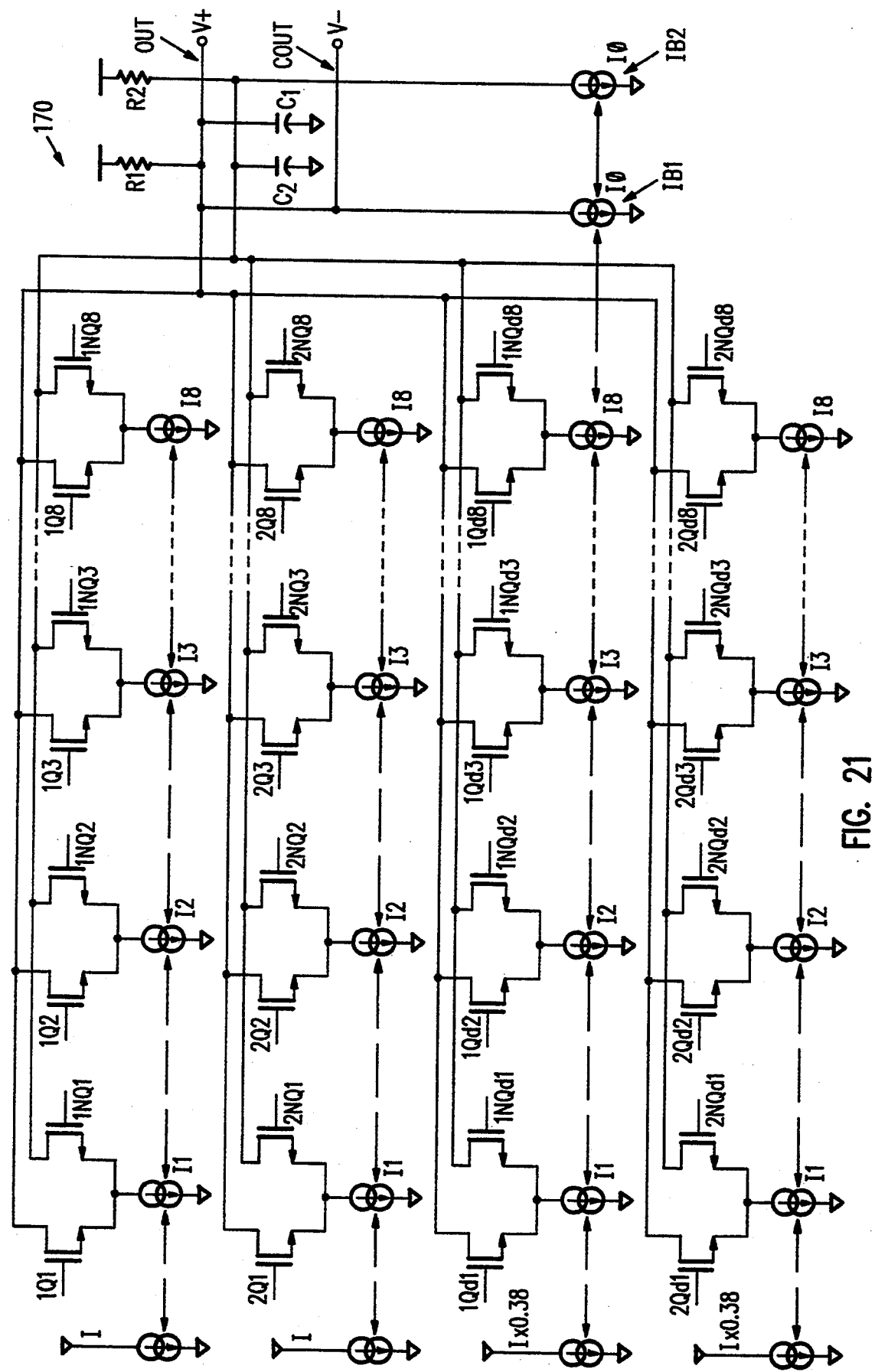
FIG. 21 is a block diagram illustrating weighted current sum stage 170.

FIG. 21 shows a block diagram that illustrates weighted current sum stage 170. As shown in FIG. 21, although depicted differently, weighted current sum stage 170, with one exception, is identical to weighted current sum stage 18 of FIG. 7, e.g., one current source corresponds to each pair of logic signals, and therefore operates as described above. Thus, as with weighted current sum stage 18, each pair of logic signals Q/NQ and its corresponding pair of delayed logic signals Qd/NQd simultaneously generate both an incremental portion of the output waveform V+ and an incremental portion of the output waveform V− by generating incremental currents. Thus, the instantaneous value of the output waveform V+ is determined by summing together all the incremental portions of the output waveform V+ while the instantaneous value of the output waveform V− is also determined by summing together all the incremental portions of the output waveform V−.

The one exception is that weighted current sum stage 170 also includes a pair of bias current sources IB1 and IB2 that establish a bias voltage at nodes OUT and COUT when no other current is present. As shown in FIG. 21, current source IB1 is connected between output resistor R1 and output capacitor C1 while current source IB2 is connected between complementary output resistor R1 and complementary output capacitor C2.

To save power and avoid potential short circuits when the input data signal TX+ is not present for a predetermined period of time, the voltage difference between the pair of complementary output waveforms V+ and V− should ideally be equal. Since the instantaneous value of the pair of output waveforms V+ and V− is determined by summing together all of the incremental portions of the pair of output waveforms V+ and V−, the greatest power savings can be achieved when the sum total of the incremental portions is zero.

One technique for obtaining a zero sum total is to control the logic states of the plurality of pairs of complementary logic signals 1Q1/1NQ1-1Q8/1NQ8, 2Q1/2NQ1-2Q8/2NQ8, 1Qd1/1NQd1-1Qd8-1NQd8, and 2Qd1/2NQd1-2Qd8-2NQd8. For example if logic signals 1Q1/1NQ5-1Q4/1NQ8 are set to a logic high while logic signals 1Q5/1NQ1-1Q8/1NQ4 are set to a logic low, then by summing together all of the incremental portions a total voltage of zero can be achieved.

Referring again to FIG. 15, first input logic stage 130 also includes a low power circuit 190 that sets the logic states of each pair Q/NQ of first logic signals 1Q1/1NQ1-1Q8/1NQ8 so that one group of first logic signals is set to one pair of logic states, and so that a second group of first logic signals is set to an opposite pair of logic states when the phase-adjusted input signal TTX+ is undetected for the predetermined period of time.

As shown in FIG. 15, low power circuit 190 includes an inverter INV1 that transmits a local reset signal LOCALRST with a logic state that is inverted from the logic state of a NOR signal NOR to the reset input of latches D12-D18. A NOR gate N1 generates the NOR signal NOR in response to the logic states of an AND signal AND, an externally-generated idle signal IDLE, which indicates that no transmission activity has occurred for a predetermined period of time, and an externally-generated reset signal RESET. In addition, the reset signal RESET is connected to the reset input of latch D11.

Low power circuit 190 also includes an AND gate AN1 that generates the AND signal AND in response to the logic state of a latch signal LAT and the phaseadjusted input signal TTX+, and a D latch D20 that generates the latch signal LAT as a logic high in response to the falling edge of the phase adjusted input signal TTX+. In addition, an inverter INV2 transmits an inverted idle signal IDLEZ with a logic state that is inverted from the logic state of the idle signal IDLE, to the set input of latches D11-D14.

FIGS. 22A-22G show a timing diagram that illustrates the operation of low power circuit 190. When the presence of the phase-adjusted input signal TTX+ is not detected for a period of time, the idle signal IDLE and the reset signal RESET transition to a logic high. As shown in FIGS. 22A-22G, after one inverter delay, the inverted idle signal IDLEZ transitions to a logic low, thereby setting the non-inverting outputs of latches D11-D14 to a logic high while setting the inverting outputs of latches D11-D14 to a logic low.

As further shown in FIGS. 22A-22G, the rising edge of the idle signal IDLE and the reset signal RESET cause the NOR gate N1 to generate the NOR signal NOR with a logic low which, one inverter delay later, causes the local reset signal LOCALRST to transition to a logic high, thereby setting the non-inverting outputs of latches D15-D18 to a logic low while setting the inverting outputs of latches D15-D18 to a logic high.

In the preferred embodiment, latches D12-D14 are set priority latches. Therefore, although latches D12-D14 receive both the inverted idle signal IDLEZ and the local reset signal LOCALRST, the inverted idle signal IDLEZ has priority.

After the leading edge of the next phase adjusted input signal TTX+ is detected, but before the next edge of the oscillator signal OSC2, the logic state of the idle signal transitions to a logic low. As above, after one inverter delay time, the logic state of the inverted idle signal IDLEZ changes to a logic high. As shown in FIGS. 22A-22G, since both the external reset signal RESET and the local reset signal LOCALRST are still at a logic high, a logic low is set at the non-inverting outputs of latches D11-D14 while a logic high is set at the inverting outputs.

Next, the external reset signal RESET changes to a logic low, thereby allowing latch D1 to latch the phase-adjusted input signal TTX+ at the next edge of the oscillator signal OSC2. At the same time, the reset signal RESET causes the NOR gate N1 to change to a logic high. As a result, one inverter delay later, the local reset signal LOCALRST transitions to a logic low, thereby allowing latches D12-D18 to respond to the subsequent edges of the oscillator signal OSC2.

Thus, in accordance with the present invention, waveshaping circuit 100 transforms the input data signal TX+ and the delayed input data signal TXd+ into a pair of complementary sinusoidal output waveforms V+ and V−, as defined by the IEEE 802.3 10BASE-T specification, without utilizing a phase-lock-loop and, as above, without the use of external waveshaping components. As a result, the size, cost, and complexity of a 10BASE-T installation can be further reduced.

It should be understood that various alternatives to the structures described herein may be employed in practicing the present invention. It is intended that the following claims define the invention and that structures within the scope of these claims and their equivalents be covered thereby.

What is claimed is:

1. A waveshaping circuit for generating complementary output data signals, the waveshaping circuit comprising:

a frame alignment circuit that generates a phase-adjusted input signal by fixing a phase relationship between an externally-generated input signal and an externally-generated oscillator signal;

a delayed frame alignment circuit that generates a phase-adjusted delayed input signal by fixing a phase relationship between an externally-generated delayed input signal and the externally-generated oscillator signal;

an input logic stage that generates a plurality of pairs of logic signals, each pair of logic signals changing to a first pair of logic states in response to one of the edges of the oscillator signal that follows the leading edge of the phase-adjusted input signal, and changing to a second pair of logic states in response to one of the edges of the oscillator signal that follows the trailing edge of the phase-adjusted input signal;

a delayed input logic stage that generates a plurality of pairs of delayed logic signals, each pair of delayed logic signals changing to a first pair of logic states in response to one of the edges of the oscillator signal that follows the leading edge of the phase-adjusted delayed input signal, and changing to a second pair of logic states in response to one of the edges of the oscillator signal that follows the trailing edge of the phase-adjusted delayed input signal, each pair of delayed logic signals corresponding to one pair of logic signals; and a weighted current sum stage that generates an output data signal and a complementary output data signal in response to the logic states of both the plurality of pairs of logic signals and the plurality of pairs of delayed logic signals, the logic states of each pair of logic signals and its corresponding pair of delayed logic signals simultaneously generating both an incremental portion of the output data signal and an incremental portion of the complementary output data signal so that an instantaneous value of the output data signal is determined by summing together the incremental portions of the output data signal, and so that an instantaneous value of the complementary output data signal is determined by summing together the incremental portions of the complementary output data signal.

2. The circuit of claim 1 wherein the frame alignment circuit comprises:

a first latch that generates a reset signal by latching a first reset logic state in response to the leading edge of the input signal, and by changing to a second reset logic state when a delayed stop signal is in a second delayed stop logic state;

a delay line that generates a start frame signal with a first start logic state and a stop frame signal with first stop logic state when the reset signal is in the second reset logic state, that changes the logic state of the start frame signal to a second start logic state in response to a first predetermined edge of the oscillator signal that occurs after the leading edge of the input signal, and that changes the logic state of the stop frame signal to a second stop logic state in response to a second predetermined edge of the oscillator signal;

a first delay circuit that generates a delayed start signal by transitioning to a first delayed start logic state a first delay time after the start signal transitions to the first start logic state, and by transitioning to a second delayed start logic state the first delay time after the start signal transitions to the second start logic state;

a second delay circuit that generates the delayed stop signal by transitioning to a first delayed stop logic state a second delay time after the stop signal transitions to the first stop logic state, and by transitioning to the second delayed stop logic state the second delay time after the stop signal transitions to the second stop logic state; and a second latch that generates the phase-adjusted input signal by latching a first phase logic state when the delayed start signal transitions to the second delayed start logic state, and by changing to a second phase logic state when the delayed stop signal transitions to the second delayed stop logic state.

3. The circuit of claim 2 wherein the delay line comprises a plurality of serially-connected latches that are configured so that the data input of the first latch of the series is connected to an inverting output of the last latch of the series, and so that a data input of each remaining latch in the series is connected to a non-inverting output of the preceding latch in the series.

4. The circuit of claim 2 wherein the first delay time and the second delay time are substantially equivalent.

5. The circuit of claim 2 wherein the first predetermined edge includes the first rising edge.

6. The circuit of claim 5 wherein the second predetermined edge includes the fifth rising edge.

7. The circuit of claim 2 wherein the input logic stage comprises a plurality of seriallyconnected latches that are configured so that a data input of the first latch of the series is connected to the phase-adjusted input signal, so that a data input of each remaining latch in the series is connected to a non-inverting output of the preceding latch in the series, so that the oscillator signal is connected to a clock input of each even-numbered latch in the series, and so that an inverted oscillator signal is connected to a clock input each odd-numbered latch in the series.

8. The circuit of claim 7 wherein the weighted current sum stage comprises:
   an output node;
   an output resistor connected between a power supply and the output node;
   a complementary output node;
   a complementary output resistor connected between the power supply and the complementary output node;
   an output capacitor connected between the output node and ground;
   a complementary output capacitor connected between the complementary output node and ground; and
   a plurality of first current stages, each first current stage having a first transistor connected to the output node, a first current node, and one of the logic signals of one of the pairs of logic signals; a second transistor connected to the complementary output node, the first current node, and the remaining logic signal of the one of the pairs of logic signals; and a first current source connected between the first current node and ground;
   a plurality of second current stages, each second current stage having a first transistor connected to the output node, a second current node, and one of the logic signals of one of the pairs of delayed logic signals; a second transistor connected to the complementary output node, the second current node, and the remaining logic signal of the one of the pairs of delayed logic signals; and a second current source connected between the second current node and ground;
   a third current source connected between the output resistor and ground; and
   a fourth current source connected between the complementary output resistor and ground.

9. The circuit of claim 1 wherein the input logic stage includes an input low power circuit that sets the logic states of each pair of logic signals so that one group of first logic signals is set to one pair of logic states, and so that a second group of first logic signals is set to an opposite pair of logic states when the phase-adjusted input signal is undetected for a predetermined period of time; and
   wherein the delayed input logic stage includes a delayed input low power circuit that sets the logic states of each pair of delayed logic signals so that one group of delayed logic signals is set to one pair of logic states, and so that a second group of delayed logic signals is set to an opposite pair of logic states when the phase-adjusted input signal is undetected for the predetermined period of time.

10. A method for waveshaping an output data signal and a complementary output data signal, the method comprising the steps of:
   generating a phase-adjusted input signal by fixing a phase relationship between an externally-generated input signal and an externally-generated oscillator signal;
   generating a phase-adjusted delayed input signal by fixing a phase relationship between an externally-generated delayed input signal and the externally-generated oscillator signal;
   generating a plurality of pairs of logic signals, each pair of logic signals changing to a first pair of logic states in response to one of the edges of the oscillator signal that follows the leading edge of the phase-adjusted input signal, and changing to a second pair of logic states in response to one of the edges of the oscillator signal that follows the trailing edge of the phase-adjusted input signal;
   generating a plurality of pairs of delayed logic signals, each pair of delayed logic signals changing to a first pair of logic states in response to one of the edges of the oscillator signal that follows the leading edge of the phase-adjusted delayed input signal, and changing to a second pair of logic states in response to one of the edges of the oscillator signal that follows the trailing edge of the phase-adjusted delayed input signal, each pair of delayed logic signals corresponding to one pair of logic signals; and
   generating an output data signal and a complementary output data signal in response to the logic states of both the plurality of pairs of logic signals and the plurality of pairs of delayed logic signals, the logic states of each pair of logic signals and its corresponding pair of delayed logic signals simultaneously generating both an incremental portion of the output data signal and an incremental portion of the complementary output data signal so that an instantaneous value of the output data signal is determined by summing together the incremental portions of the output data signal, and so that an instantaneous value of the complementary output data signal is determined by summing together the incremental portions of the complementary output data signal.

11. A waveshaping circuit for generating complementary output data signals, the waveshaping circuit comprising:
   a frame alignment circuit that generates a phase-adjusted input signal by fixing a phase relationship between an externally-generated input signal and an externally-generated oscillator signal;
   a delayed frame alignment circuit that generates a phase-adjusted delayed input signal by fixing a phase relationship between an externally-generated delayed input signal and the externally-generated oscillator signal;

a first input logic stage that generates a plurality of pairs of first logic signals, each pair of first logic signals changing to a first pair of logic states in response to one of the edges of the oscillator signal that follows the leading edge of the phase-adjusted input signal, and changing to a second pair of logic states in response to one of the edges of the oscillator signal that follows the trailing edge of the phase-adjusted input signal;

a second input logic stage that generates a plurality of pairs of second logic signals, each pair of second logic signals changing to a first pair of logic states in response to one of the edges of a delayed oscillator signal that follows the leading edge of the phase-adjusted input signal, and changing to a second pair of logic states in response to one of the edges of the delayed oscillator signal that follows the trailing edge of the phase-adjusted input signal;

a first delayed input logic stage that generates a plurality of pairs of first delayed logic signals, each pair of first delayed logic signals changing to a first pair of logic states in response to one of the edges of the oscillator signal that follows the leading edge of the phase-adjusted delayed input signal, and changing to a second pair of logic states in response to one of the edges of the oscillator signal that follows the trailing edge of the phase-adjusted delayed input signal, each pair of first delayed logic signals corresponding to one pair of first logic signals;

a second delayed input logic stage that generates a plurality of pairs of second delayed logic signals, each pair of second delayed logic signals changing to a first pair of logic states in response to one of the edges of a delayed oscillator signal that follows the leading edge of the phase-adjusted delayed input signal, and changing to a second pair of logic states in response to one of the edges of the delayed oscillator signal that follows the trailing edge of the phase-adjusted delayed input signal, each pair of second delayed logic signals corresponding to one pair of second logic signals; and a weighted current sum stage that generates an output data signal and a complementary output data signal in response to the logic states of the plurality of pairs of first logic signals, the plurality of pairs of second logic signals, the plurality of pairs of first delayed logic signals, and the plurality of pairs of second delayed logic signals, the logic states of each pair of first logic signals and its corresponding pair of first delayed logic signals, and the logic states of each pair of second logic signals and its corresponding pair of second delayed logic signals simultaneously generating both an incremental portion of the output data signal and an incremental portion of the complementary output data signal so that an instantaneous value of the output data signal is determined by summing together the incremental portions of the output data signal, and so that an instantaneous value of the complementary output data signal is determined by summing together the incremental portions of the complementary output data signal.

12. The circuit of claim 11 wherein the frame alignment circuit comprises:

a first latch that generates a reset signal by latching a first reset logic state in response to the leading edge of the input signal, and by changing to a second reset logic state when a delayed stop signal is in a second delayed stop logic state;

a delay line that generates a start frame signal with a first start logic state and a stop frame signal with first stop logic state when the reset signal is in the second reset logic state, that changes the logic state of the start frame signal to a second start logic state in response to a first predetermined edge of the oscillator signal that occurs after the leading edge of the input signal, and that changes the logic state of the stop frame signal to a second stop logic state in response to a second predetermined edge of the oscillator signal;

a first delay circuit that generates a delayed start signal by transitioning to a first delayed start logic state a first delay time after the start signal transitions to the first start logic state, and by transitioning to a second delayed start logic state the first delay time after the start signal transitions to the second start logic state;

a second delay circuit that generates the delayed stop signal by transitioning to a first delayed stop logic state a second delay time after the stop signal transitions to the first stop logic state, and by transitioning to the second delayed stop logic state the second delay time after the stop signal transitions to the second stop logic state; and a second latch that generates the phase-adjusted input signal by latching a first phase logic state when the delayed start signal transitions to the second delayed start logic state, and by changing to a second phase logic state when the delayed stop signal transitions to the second delayed stop logic state.

13. The circuit of claim 12 wherein the delay line comprises a plurality of serially-connected latches that are configured so that the data input of the first latch of the series is connected to an inverting output of the last latch of the series, and so that a data input of each remaining latch in the series is connected to a non-inverting output of the preceding latch in the series.

14. The circuit of claim 12 wherein the first delay time and the second delay time are substantially equivalent.

15. The circuit of claim 12 wherein the first predetermined edge includes the first rising edge.

16. The circuit of claim 15 wherein the second predetermined edge includes the fifth rising edge.

17. The circuit of claim 12 wherein the first input logic stage comprises a plurality of serially-connected latches that are configured so that a data input of the first-latch of the series is connected to the phase-adjusted input signal, so that a data input of each remaining latch in the series is connected to a non-inverting output of the preceding latch in the series, so that the oscillator signal is connected to a clock input of each even-numbered latch in the series, and so that an inverted oscillator signal is connected to a clock input each odd-numbered latch in the series.

18. The circuit of claim 17 wherein the weighted current sum stage comprises:

an output node;

an output resistor connected between a power supply and the output node;

a complementary output node;

a complementary output resistor connected between the power supply and the complementary output node;

an output capacitor connected between the output node and ground;

a complementary output capacitor connected between the complementary output node and ground; and a plurality of first current stages, each first current stage having a first transistor connected to the output node, a first current node, and one of the logic signals of one of the pairs of first logic signals; a second transistor connected to the complementary output node, the first current node, and the remaining logic signal of the one of the pairs of first logic signals; and a first current source connected between the first current node and ground;

a plurality of second current stages, each second current stage having a first transistor connected to the output node, a second current node, and one of the logic signals of one of the pairs of first delayed logic signals; a second transistor connected to the complementary output node, the second current node, and the remaining logic signal of the one of the pairs of first delayed logic signals; and a second current source connected between the second current node and ground;

a plurality of third current stages, each third current stage having a first transistor connected to the output node, a third current node, and one of the logic signals of one of the pairs of second logic signals; a second transistor connected to the complementary output node, the third current node, and the remaining logic signal of the one of the pairs of second logic signals; and a third current source connected between the third current node and ground;

a plurality of fourth current stages, each fourth current stage having a first transistor connected to the output node, a fourth current node, and one of the logic signals of one of the pairs of second delayed logic signals; a second transistor connected to the complementary output node, the fourth current node, and the remaining logic signal of the one of the pairs of second delayed logic signals; and a fourth current source connected between the fourth current node and ground;

a fifth current source connected between the output resistor and ground; and a sixth current source connected between the complementary output resistor and ground.

19. The circuit of claim 11 wherein the first input logic stage includes a first input low power circuit that sets the logic states of each pair of first logic signals so that one group of first logic signals is set to one pair of logic states, and so that a second group of first logic signals is set to an opposite pair of logic states when the phase-adjusted input signal is undetected for a predetermined period of time;

wherein the second input logic stage includes a second input low power circuit that sets the logic states of each pair of second logic signals so that one group of second logic signals is set to one pair of logic states, and so that a second group of second logic signals is set to an opposite pair of logic states when the phase-adjusted input signal is undetected for the predetermined period of time;

wherein the first delayed input logic stage includes a first delayed low power circuit that sets the logic states of each pair of first delayed logic signals so that one group of first delayed logic signals is set to one pair of logic states, and so that a second group of first delayed logic signals is set to an opposite pair of logic states when the phase-adjusted input signal is undetected for the predetermined period of time; and wherein the second delayed input logic stage includes a second delayed low power circuit that sets the logic states of each pair of second delayed logic signals so that one group of second delayed logic signals is set to one pair of logic states, and so that a second group of second delayed logic signals is set to an opposite pair of logic states when the phase-adjusted input signal is undetected for the predetermined period of time.

* * * * *